(12) United States Patent
Tsuura

(10) Patent No.: US 6,897,541 B2
(45) Date of Patent: May 24, 2005

(54) SEMICONDUCTOR INTEGRATED CIRCUIT DEVICE AND METHOD OF PRODUCING THE SAME

(75) Inventor: Katsuhiko Tsuura, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/673,479

(22) Filed: Sep. 30, 2003

(65) Prior Publication Data

US 2004/0061225 A1 Apr. 1, 2004

Related U.S. Application Data

(62) Division of application No. 10/369,548, filed on Feb. 21, 2003, now Pat. No. 6,677,195, which is a division of application No. 09/599,354, filed on Jul. 21, 2000, now Pat. No. 6,562,674.

(30) Foreign Application Priority Data

Jul. 6, 1999 (JP) .......................................... 11-191798

(51) Int. Cl.⁷ ............................................. H01L 29/00
(52) U.S. Cl. ..................................... 257/529; 257/528
(58) Field of Search ................................ 257/529, 528, 257/530, 758, 759, 764, 765

(56) References Cited

U.S. PATENT DOCUMENTS

| | | | |
|---|---|---|---|
| 4,841,354 A | | 6/1989 | Inaba |
| 5,675,174 A | * | 10/1997 | Nakajima et al. ............ 257/529 |
| 5,716,871 A | * | 2/1998 | Yamazaki et al. ........... 438/215 |
| 5,729,041 A | * | 3/1998 | Yoo et al. .................... 257/529 |
| 6,180,503 B1 | * | 1/2001 | Tzeng et al. ................. 438/600 |
| 6,380,003 B1 | | 4/2002 | Jahnes et al. |
| 6,562,674 B1 | * | 5/2003 | Tsuura ......................... 438/215 |
| 6,677,195 B2 | * | 1/2004 | Tsuura ......................... 438/215 |

FOREIGN PATENT DOCUMENTS

| | | |
|---|---|---|
| JP | 5251564 | 9/1993 |
| JP | 7297289 | 11/1995 |
| JP | 8213469 | 8/1996 |
| JP | 8321550 | 12/1996 |
| JP | 11017011 | 1/1999 |
| JP | 11087647 | 3/1999 |

* cited by examiner

*Primary Examiner*—David Nhu
(74) *Attorney, Agent, or Firm*—Stevens, Davis, Miller & Mosher, LLP

(57) ABSTRACT

A semiconductor integrated circuit device has: a layer insulating film formed on a semiconductor substrate; a fuse portion which is configured by an uppermost metal wiring layer that is formed on the layer insulating film; an inorganic insulating protective film which is formed on the metal wiring layer and the layer insulating film; and an organic insulating protective film which is formed on the inorganic insulating protective film. An opening is formed in the organic insulating protective film so that the inorganic insulating protective on the fuse portion is exposed. According to this configuration, it is not required to etch away the layer insulating film in order to form an opening above the fuse portion. Therefore, the time period required for forming the opening can be shortened and the whole production time period can be shortened. Since only the inorganic insulating protective film is formed above the fuse portion, the cutting off of the fuse portion can be performed without excessively increasing the irradiation energy of a laser beam. Therefore, high reliability and high productivity can be realized without causing the lowering of the reliability and the reduction of the production yield which are due to the cutting off of the fuse portion. Since the fuse portion is covered with the inorganic insulating protective film, the moisture resistance can be improved.

12 Claims, 23 Drawing Sheets

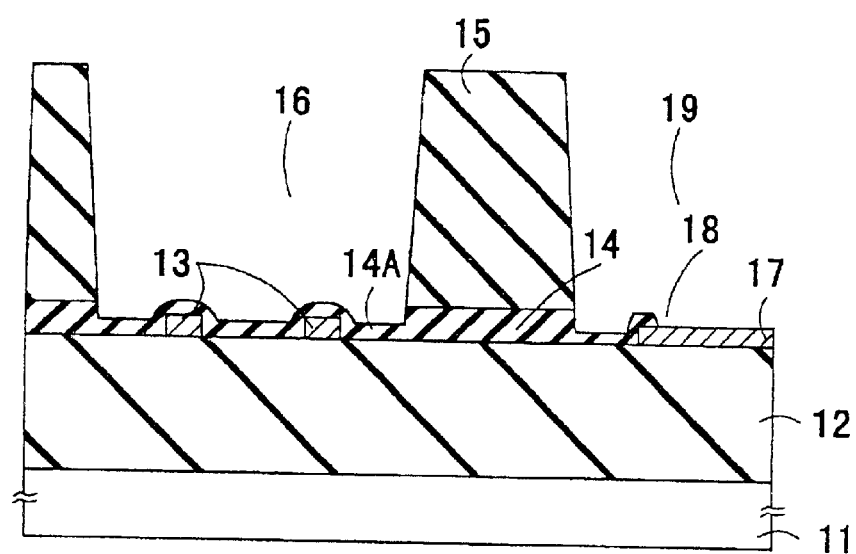
F I G. 1

F I G. 4
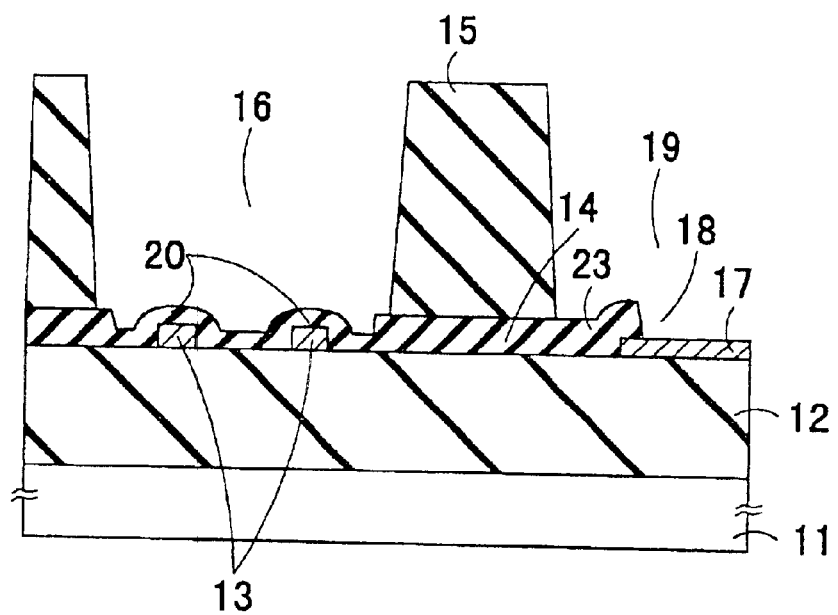

F I G. 9A
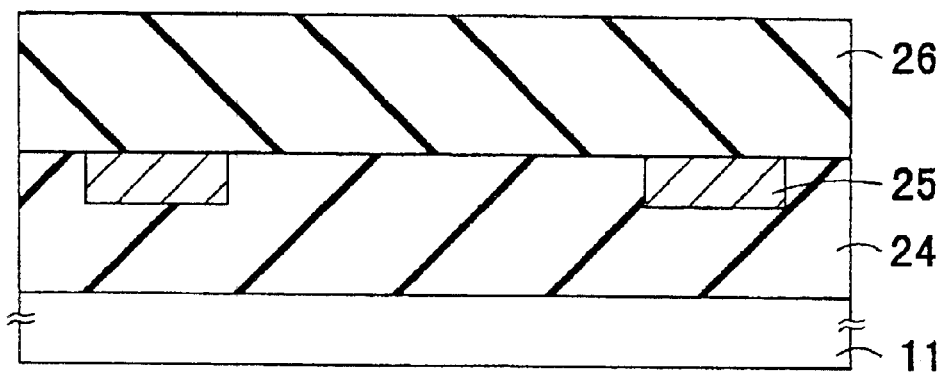
F I G. 9B
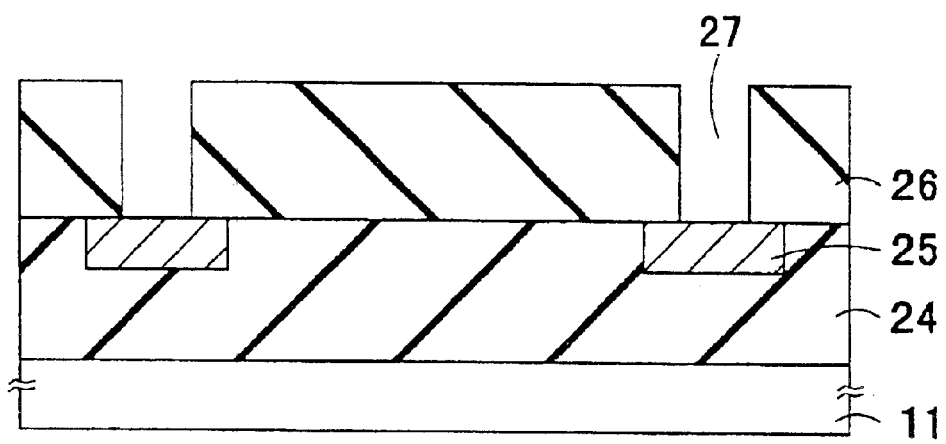

SEMICONDUCTOR INTEGRATED CIRCUIT DEVICE AND METHOD OF PRODUCING THE SAME

This is a divisional of application Ser. No. 10/369,548 filed Feb. 21, 2003, now U.S. Pat. No. 6,679,195 which is a divisional of application Ser. No. 09/599,354 filed Jul. 21, 2000 (U.S. Pat. No. 6,562,674).

BACKGROUND OF THE INVENTION

1. Field of the Invention

The present invention relates to a semiconductor integrated circuit device having a fuse portion which is used as, for example, a redundancy relieving circuit or a function adjusting circuit for a mass storage memory, and also to a method of producing the device.

2. Description of the Prior Art

Recently, the fine pattern technique for a semiconductor integrated circuit has been largely advanced. As a result, a memory device configured by a semiconductor integrated circuit, typically, a dynamic random access memory (DRAM) or a static random access memory (SRAM) which has a capacity of a Gbit class has been developed. In order to achieve high integration, wirings for connecting circuit elements are realized by using the multilayer interconnect technology. As the storage capacity of a semiconductor integrated circuit is expanding with the advance of the fine pattern technique, minute dust or the like in the production process causes defective bits which may lower the function of the element or produce a functional failure, whereby the whole of the semiconductor integrated circuit is made defective. This causes a problem in that the production yield is lowered.

As a method of solving the problem, known is a redundancy relief technique. This is a technique of relieving defective bits. In this technique, during a process of producing a chip, spare memory bits are produced in addition to memory bits required in the memory of a product. When there is a defect in a part of the chip and a defective memory bit is therefore produced, the defective memory bit is switched to one of the spare memory bits, so that the whole of the memory bits of a product is configured by non-defective bits. As one of methods of switching a defective memory bit to a spare memory bit, used is a redundancy relief technique based on laser processing in which a fuse portion of a redundancy relieving circuit on a chip is fused and cut off by irradiation with a laser beam, thereby realizing the switching.

In view of simplicity of the production process, conventionally, a material which is mainly composed of polysilicon and silicide that are identical with materials of gate electrodes and bit signal lines of MOS transistors, and polycide configured by laminating polysilicon and silicide is used as a fuse material which is to be laser-processed.

Hereinafter, a fuse portion which is used in a redundancy relieving circuit in the conventional art will be described. FIG. 17 is a section view showing main portions of a conventional semiconductor integrated circuit device. Referring to FIG. 17, 1 denotes a semiconductor substrate, 2 denotes a layer insulating film, 3 denotes fuse portions which are configured by, for example, a polycide layer, 4 denotes an inorganic insulating protective film, 5 denotes an organic insulating protective film, 6 denotes an opening, and 7 denotes a pad electrode which is configured by a metal wiring layer. The pad electrode 7 is an electrode for connecting a lead for package assembling. The organic insulating protective film 5 and the inorganic insulating protective film 4 above the pad electrode 7 are removed away by a usual etching technique so as to form an opening. At the same time, in order to facilitate the cutting of the fuse portions 3 by laser beam irradiation, the organic insulating protective film 5 and the inorganic insulating protective film 4 above the fuse portions 3 are removed away by selective etching to form the opening 6, and a layer insulating film 8 on the fuse portions 3 is thinned.

In a semiconductor integrated circuit device, a multilayer interconnect structure has begun to be employed in order to cope with requirements for high integration and fine patterning. In the configuration of the conventional art, consequently, there arises a new technical problem. Namely, the use of a multilayer interconnect structure causes a large number of wiring layers to exist above a fuse portion which is configured by a polycide layer and the like in the same manner as a gate electrode. As a result, the thickness of the layer insulating film above the fuse portion is increased.

In order to cope with this, by selective etching, an insulating film and a layer insulating film above a fuse portion are removed away and the remaining film is thinned. In order to achieve high integration in a semiconductor integrated circuit device, recently, some multilayer interconnect structures are configured by three or more layers, so that a layer insulating film above a fuse portion has a large thickness. Therefore, the layer insulating film must be etched away by a thickness of about 1 to several $\mu$m or more, with the result that the etching removal requires a long time period. This causes the throughput of an etching apparatus to be lowered, thereby producing a technical problem in that the production time period is prolonged. In a large wafer having a diameter of 8 inches or more, furthermore, it is difficult to suppress interfacial unevenness and variation of the etching rate in a etching removal step to a low degree, thereby producing a technical problem in that it is difficult to control correctly and uniformly the thickness of a layer insulating film remaining above a fuse portion, over the whole face of the wafer.

SUMMARY OF THE INVENTION

It is an object of the invention to provide a semiconductor integrated circuit device in which a time period required for forming an opening above a fuse portion can be shortened to attain a short production time period, and also a method of producing the device.

The semiconductor integrated circuit device of the invention is characterized in that the device comprises: a layer insulating film formed on a semiconductor substrate; a fuse portion which is configured by an uppermost metal wiring layer that is formed on the layer insulating film; an inorganic insulating protective film which is formed on the metal wiring layer and the layer insulating film; and an organic insulating protective film which is formed on the inorganic insulating protective film, and an opening is formed in the organic insulating protective film so that the inorganic insulating protective on the fuse portion is exposed.

According to this configuration, it is requested only that the fuse portion is formed by the uppermost metal wiring layer formed on the layer insulating film, and the opening is disposed in the organic insulating protective film as an opening above the fuse portion. Unlike the conventional art, it is not required to etch away the layer insulating film in order to form an opening above the fuse portion. Therefore, the time period required for forming the opening can be shortened and the whole production time period can be shortened. Since only the inorganic insulating protective film is formed above the fuse portion, the cutting off of the fuse portion can be performed without excessively increasing the irradiation energy of a laser beam. Therefore, the cutting off of the fuse portion does not cause the reliability to be lowered, nor the production yield to be reduced. Since the fuse portion is covered with the inorganic insulating protective film, the moisture resistance can be improved.

The semiconductor integrated circuit device of the invention may be configured so that the device further comprises an external lead electrode on the layer insulating film, the external lead electrode being configured by the metal wiring layer, and an opening is disposed in the inorganic insulating protective film and the organic insulating protective film which are above the external lead electrode, so as to expose a surface of the external lead electrode.

According to this configuration, the opening above the fuse portion can be formed simultaneously with the opening of the organic insulating protective film and above the external lead electrode, and hence a time period dedicated to forming the opening above the fuse portion is not particularly required.

The semiconductor integrated circuit device of the invention may be configured so that the metal wiring layer is configured by a laminated film having at least a main conducting metal layer and a barrier metal layer which serves as a lower layer, and, in at least a fusion-cut area of the fuse portion, the barrier metal layer of the metal wiring layer configured by the laminated film is removed away.

According to this configuration, the fusion-cut area of the fuse portion is configured by the metal wiring layer in which the lower layer or the barrier metal layer is removed away, and hence the barrier metal layer having a high melting point does not exist in the fuse portion. Consequently, the cutting off of the fuse portion can be performed easily and surely without increasing the irradiation energy of a laser beam, and the lowering of the reliability and the reduction of the production yield which are due to the cutting off of the fuse portion can be further eliminated.

Preferably, the semiconductor integrated circuit device of the invention may be configured so that the metal wiring layer is configured by a laminated film having at least a main conducting metal layer and a barrier metal layer which serves as a lower layer, and, in at least a fusion-cut area of the fuse portion, the barrier metal layer has a thickness of 150 nm or less.

According to this configuration, the fusion-cut area of the fuse portion is configured so that the lower layer or the barrier metal layer is thinned or has a thickness of 150 nm or less. In the process of cutting off the fuse portion by a laser beam, therefore, the cutting off can be surely performed without leaving the barrier metal layer below the fuse portion.

The semiconductor integrated circuit device of the invention may be configured so that the metal wiring layer serving as the fuse portion is embedded into a trench which is formed in the layer insulating film.

Preferably, the semiconductor integrated circuit device of the invention may be configured so that at least one end of the fuse portion configured by the metal wiring layer is connected to a lower wiring layer through a plug electrode in a contact hole which is disposed in the layer insulating film.

According to this configuration, the fuse wiring can be reconnected to the lower wiring layer through the plug electrode in the contact hole, whereby the route along which water and ions permeate from the cut away part of the fuse portion via the fuse wiring which remains after the cutting off is prolonged. Therefore, water and ions are prevented from entering the internal semiconductor element, thereby contributing to improved reliability. In this case, more preferably, a guard band which is configured by a conductive layer may be disposed so as to surround the fuse portion and the contact hole. The inner side of the guard band can block penetration of water and ions, and hence water and ions are prevented from advancing to the outside of the guard band (the semiconductor element portion), thereby contributing to further improved reliability.

Preferably, the semiconductor integrated circuit device of the invention may be configured so that the inorganic insulating protective film on the fuse portion has a thickness which is not smaller than 0.1 µm and not larger than 0.8 µm. According to this configuration, in the process of cutting off the fuse portion by a laser beam, the fuse portion can be easily cut off while preventing the ground of the fuse portion from being damaged.

Preferably, the semiconductor integrated circuit device of the invention may be configured so that a wiring width of the fusion-cut area of the fuse portion is not smaller than 0.1 µm and not larger than 1.0 µm. According to this configuration, in the process of cutting off the fuse portion by a laser beam, the fuse portion can be cut off easily and surely.

The semiconductor integrated circuit device of the invention may be configured so that, with respect to one fuse portion which is electrically continuous, two or more parts are fused off by irradiation with a laser beam. According to this configuration, the electrical cutting off of the fuse portion can be performed more surely.

The semiconductor integrated circuit device of the invention may be configured so that a plurality of fuse portions are disposed in one opening of the organic insulating protective film, and fusion-cut areas of the plurality of fuse portions are arranged on a straight line. According to this configuration, the electrical cutting off of the fuse portions by irradiation with a laser beam can be rapidly performed. Therefore, the throughput is improved so that the productivity can be enhanced.

The method of producing a semiconductor integrated circuit device of the invention characterized in that the method comprises: a first step of forming a fuse portion configured by an uppermost metal wiring layer, on a layer insulating film formed on a semiconductor substrate; a second step of forming an inorganic insulating protective film on the metal wiring layer and the layer insulating film; a third step of forming an organic insulating protective film on the semiconductor substrate on which the inorganic insulating protective film is formed; and a fourth step of forming an opening in the organic insulating protective film so that the inorganic insulating protective on the fuse portion is exposed.

According to this production method, it is requested only that the fuse portion is formed by the uppermost metal wiring layer formed on the layer insulating film, and the opening is disposed in the organic insulating protective film as an opening above the fuse portion. Unlike the conventional art, it is not required to etch away the layer insulating film in order to form an opening on the fuse portion. Therefore, the time period required for forming the opening can be shortened and the whole production time period can be shortened. Since only the inorganic insulating protective film is formed above the fuse portion, the cutting off of the fuse portion can be performed without excessively increasing the irradiation energy of a laser beam. Therefore, the cutting off of the fuse portion does not cause the reliability to be lowered, nor the production yield to be reduced. Since the fuse portion is covered with the inorganic insulating protective film, the moisture resistance can be improved.

Preferably, the method of producing a semiconductor integrated circuit device of the invention may be configured so that the method further comprises the steps of: in the first step, forming an external lead electrode on the layer insulating film, the external lead electrode being configured by the metal wiring layer; after the second step and before the third step, forming an opening in the inorganic insulating protective film above the external lead electrode so as to expose a surface of the external lead electrode; and, in the fourth step, forming an opening in the organic insulating protective film above the external lead electrode so as to expose the surface of the external lead electrode.

According to this production method, since also the external lead electrode is formed by the uppermost metal wiring layer, the opening of the organic insulating protective film above the fuse portion can be formed simultaneously with the opening of the organic insulating protective film above the external lead electrode, and hence a time period dedicated to forming the opening of the organic insulating protective film above the fuse portion is not particularly required.

Preferably, the method of producing a semiconductor integrated circuit device of the invention may be configured so that, in the first step, the metal wiring layer is configured by a laminated film having at least a barrier metal layer and a main conducting metal layer, and the method further comprises the steps of: forming the barrier metal layer on the layer insulating film, the barrier metal layer in at least a fusion-cut area of the fuse portion being removed away; forming the main conducting metal layer on the barrier metal layer and the layer insulating film; and etching the main conducting metal layer and the barrier metal layer into a desired pattern, thereby forming the fuse portion.

According to this production method, the fusion-cut area of the fuse portion is configured by the metal wiring layer in which the lower layer or the barrier metal layer is removed away, and hence the barrier metal layer having a high melting point does not exist in the fuse portion. Consequently, the cutting off of the fuse portion can be performed easily and surely without increasing the irradiation energy of a laser beam, and the lowering of the reliability and the reduction of the production yield which are due to the cutting off of the fuse portion can be further eliminated.

In the method of producing a semiconductor integrated circuit device of the invention, in the first step, a trench may be formed in the layer insulating film formed on the semiconductor substrate, and the metal wiring layer may be then embedded into the trench, thereby forming the fuse portion.

Preferably, the method of producing a semiconductor integrated circuit device of the invention may be configured so that the method further comprises, before the first step, the steps of: forming a wiring trench in a lower layer insulating film which is formed on the semiconductor substrate; forming a lower wiring layer which is embedded into the wiring trench; forming the layer insulating film on the semiconductor substrate on which the lower wiring layer is formed; forming a contact hole in the layer insulating film on the lower wiring layer; and forming a plug electrode in the contact hole, and, in the first step, the fuse portion is formed so that at least one end of the fuse portion is connected to the lower wiring layer through the plug electrode in the contact hole which is disposed in the layer insulating film.

According to this production method, the fuse wiring is connected to the lower wiring layer through the plug electrode in the contact hole, whereby the route along which water and ions permeate from the cut away part of the fuse portion via the fuse wiring which remains after the cutting off is prolonged. Therefore, water and ions are prevented from entering the internal semiconductor element, thereby contributing to improved reliability.

Preferably, the method of producing a semiconductor integrated circuit device of the invention may be configured so that the method further comprises the step of, after the fourth step, etching the inorganic insulating protective film on the fuse portion so as to have a predetermined thickness, the inorganic insulating protective film being exposed in the opening of the organic insulating protective film.

Alternatively, the method of producing a semiconductor integrated circuit device of the invention may be configured so that the method further comprises the step of, after the second step and before the third step, etching the inorganic insulating protective film on the fuse portion so as to have a predetermined thickness. When the inorganic insulating protective film on the fuse portion is etched as described above, the laser cutting of the fuse portion can be easily performed while preventing the ground of the fuse portion from being damaged.

Preferably, the method of producing a semiconductor integrated circuit device of the invention may be configured so that the method further comprises the step of, after the fourth step, with respect to one fuse portion which is electrically continuous, fusing off two or more parts by irradiation with a laser beam. When two or more parts are fused off by laser beam irradiation as described above, the electrical cutting off of the fuse portion can be performed more surely.

Preferably, the method of producing a semiconductor integrated circuit device of the invention may be configured so that a plurality of fuse portions are disposed in one opening of the organic insulating protective film, and fusion-cut areas of the plurality of fuse portions are arranged on a straight line. According to this configuration, the electrical cutting off of the fuse portions by irradiation with a laser beam can be rapidly performed. Therefore, the throughput is improved so that the productivity can be enhanced.

BRIEF DESCRIPTION OF THE DRAWINGS

FIG. 1 is a section view showing main portions of a semiconductor integrated circuit device of a first embodiment of the invention;

FIG. 4 is a section view showing main portions of a semiconductor integrated circuit device of a second embodiment of the invention;

FIGS. 9A to 9G are section views showing steps of a method of producing the semiconductor integrated circuit device of the third embodiment of the invention;

DETAILED DESCRIPTION OF THE PREFERRED EMBODIMENT

Figure 2A:
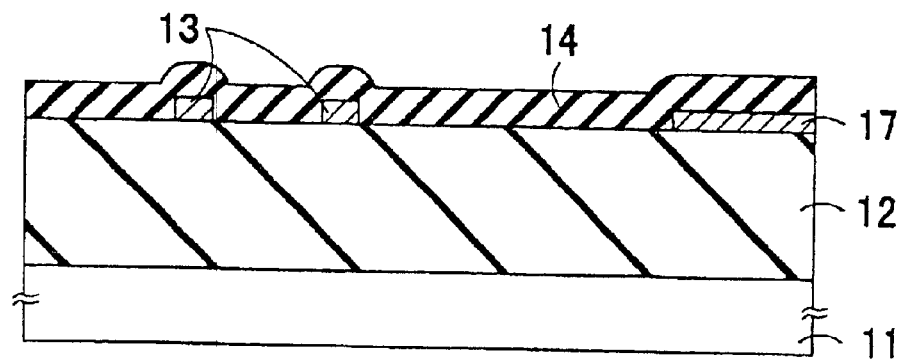
FIGS. 2A to 2C are section views showing steps of a method of producing the semiconductor integrated circuit device of the first embodiment of the invention.

Hereinafter, embodiments of the invention will be described with reference to the accompanying drawings.

[First Embodiment]

FIG. 1 is a section view showing main portions of a semiconductor integrated circuit device of a first embodiment of the invention. Referring to FIG. 1, 11 denotes a semiconductor substrate, 12 denotes a layer insulating film, 13 denotes fuse portions which are configured by a metal wiring layer, 14 denotes an inorganic insulating protective film, 15 denotes an organic insulating protective film, 16 and 19 denote openings of the organic insulating protective film 15, 17 denotes a pad electrode which is an external lead electrode configured by the metal wiring layer, and 18 denotes an opening of the inorganic insulating protective film 14.

In the semiconductor integrated circuit of the embodiment, the fuse portions 13 and the pad electrode 17 are formed by the uppermost metal wiring layer which is formed on the layer insulating film 12, the opening 16 of the organic insulating protective film 15 is disposed above the fuse portions 13, and the upper portion of the pad electrode 17 is opened through the opening 18 of the inorganic insulating protective film 14, and the opening 19 of the organic insulating protective film 15. In order to thin the inorganic insulating protective film 14 on the fuse portions 13, the inorganic insulating protective film 14 exposed through the openings 16 and 19 of the organic insulating protective film is etched so as to be thinner than the inorganic insulating protective film 14 below the organic insulating protective film 15. The opening 19 of the organic insulating protective film 15 and disposed above the pad electrode 17 is formed in a range which is wider than the opening 18 of the inorganic insulating protective film 14, and in the region of the pad electrode 17 and its vicinity.

In the embodiment described above, the size of the pad electrode 17 serving as an external lead electrode is reduced to a minimum level which is allowed from the view point of the package assembly, so that a large number of pad electrodes 17 are mounted at a high density, and, in order to suppress the chip size, the opening 19 is larger than the opening 18. The size relationships are not restricted to the above. It is a matter of course that the opening 19 may be identical in size with the opening 18, or the opening 19 may be smaller than the opening 18. In the above, the case where the inorganic insulating protective film 14A is thinned has been described. The invention is not restricted to this. It is a matter of course that, when, for example, the inorganic insulating protective film 14A is originally thin from the view point of fuse cutting, the thinning is not required to be particularly performed.

In the embodiment described above, the two fuse portions 13 are formed below the one opening 16. The number of the fuse portions is not restricted to this. It is a matter of course that, below the one opening 16, only one fuse portion 13 may be formed or three or more fuse portions 13 may be formed.

Figure 2B:
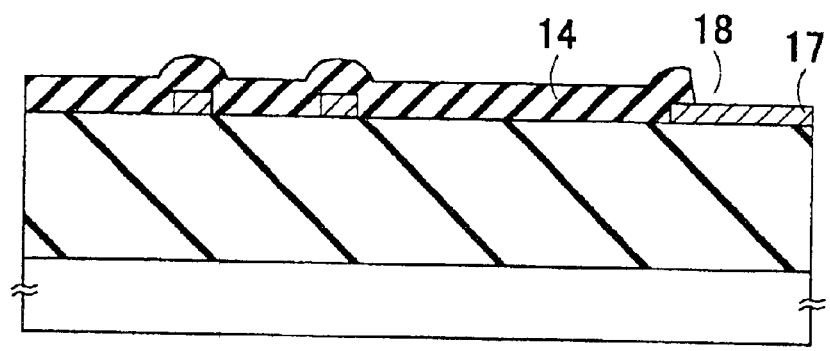
Figure 2C:
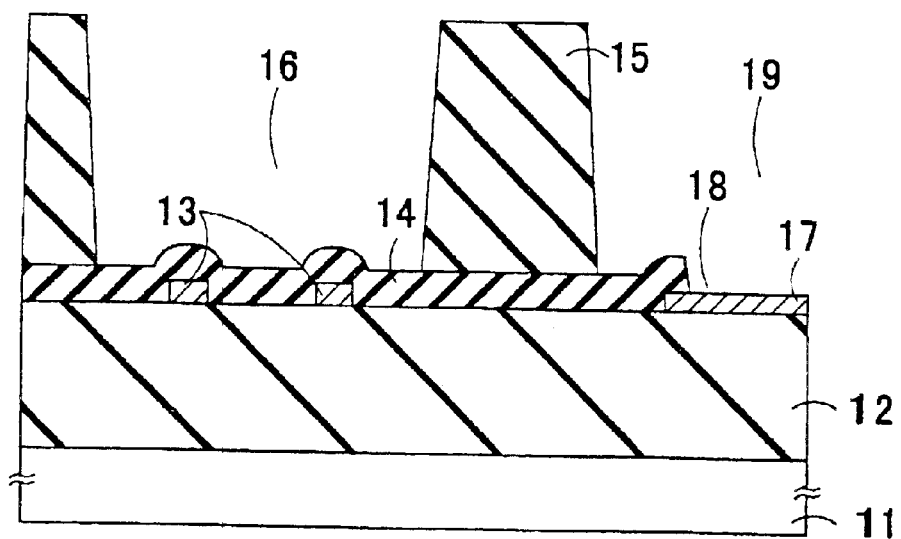
Figure 3:
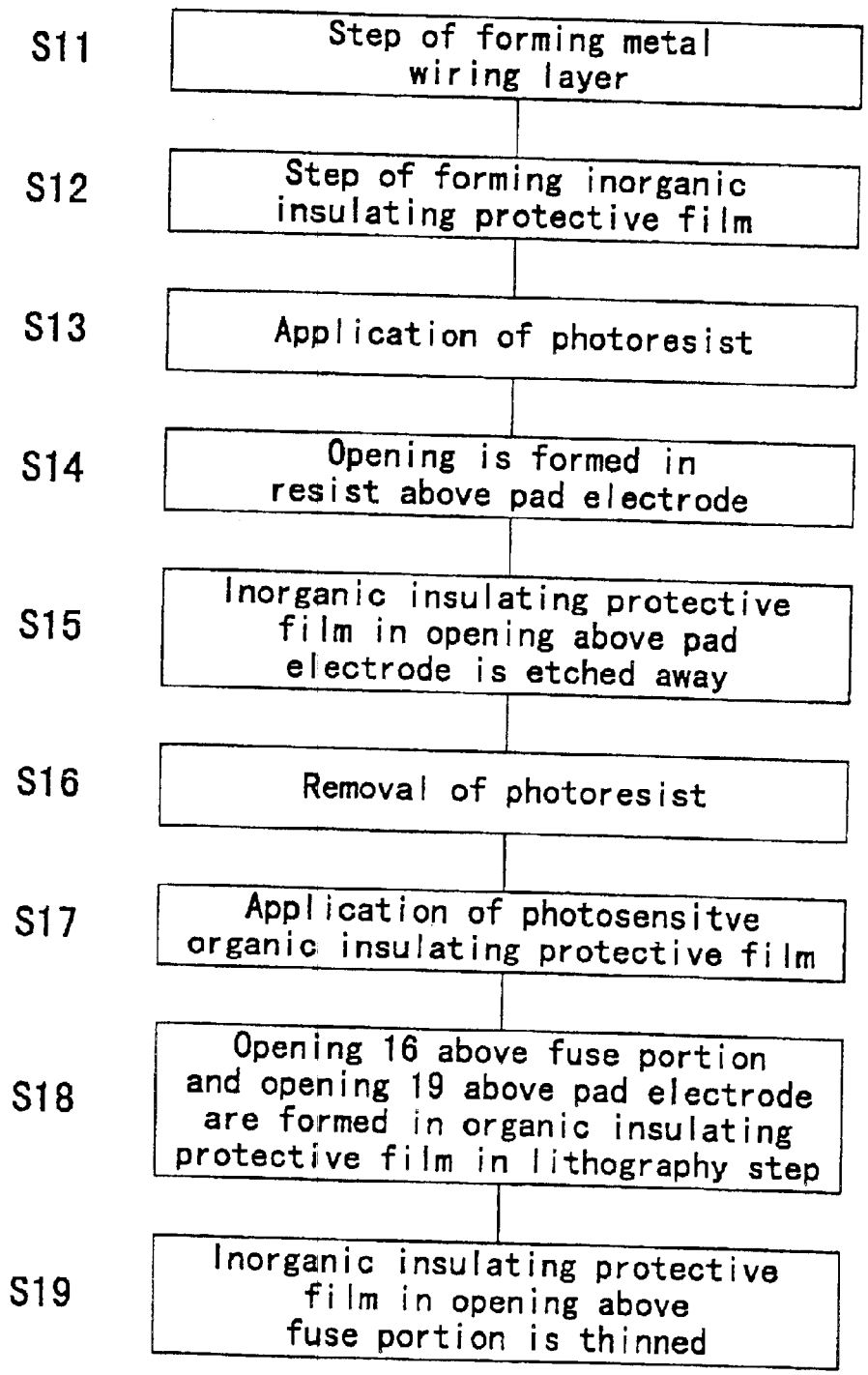
FIG. 3 is a flowchart showing the method of producing the semiconductor integrated circuit device of the first embodiment of the invention.

FIGS. 2A to 2C are section views showing steps of a method of producing the semiconductor integrated circuit device of the first embodiment of the invention, and FIG. 3 is a flowchart showing steps of the production method. Hereinafter, the production method will be described with reference to FIGS. 2A to 2C, and 3.

Elements formed on the semiconductor substrate 11 are connected to one another by multi wiring layers (not shown). On the layer insulating film 12 of the multi wiring layers, the fuse portions 13 and the pad electrode 17 are formed by the uppermost metal wiring layer. The inorganic insulating protective film 14 such as a plasma silicon nitride film [a silicon nitride film formed by the plasma CVD (Chemical Vapor Deposition) method] is formed at a thickness of about 0.6 $\mu$m on the fuse portions and the pad electrode (FIG. 2A, and steps S11 and S12 of FIG. 3).

Thereafter, a photoresist (not shown) is applied, and an opening is formed in the resist above the pad electrode 17. Then, a usual dry etching process is performed, so that the inorganic insulating protective film 14 above the pad electrode 17 is removed away by selective etching, thereby forming the opening 18. Thereafter, the photoresist (not shown) is removed away (FIG. 2B, and steps S13 to S16 of FIG. 3).

Next, the organic insulating protective film 15 which is photosensitve is applied at a thickness of about 10 $\mu$m over the whole face, and then patterned in a lithography step to form the opening 16 above the fuse portions 13, and the opening 19 above the pad electrode 17 (FIG. 2C, and steps S17 and S18 of FIG. 3). Usually, a photosensitve polyimide film or the like is used as the organic insulating protective film 15. The kind of the film is not restricted to this. Although the case where the thickness is about 10 $\mu$m has been described, it is a matter of course that the thickness is not restricted to this value.

When the inorganic insulating protective film 14 is formed at a thickness of about 1 $\mu$m, the inorganic insulating protective film 14 exposed through the openings 16 and 19 is etched as required so that the inorganic insulating protective film 14A above the fuse portions 13 is thinned to a thickness of 0.1 to 0.8 µm (the configuration of FIG. 1, and step S19 of FIG. 3). The etching amount is not restricted to this. It tends that, as the inorganic insulating protective film 14A above the fuse portions 13 is thinner, the cutting of the fuse portions 13 can be performed more surely.

Figure 17:
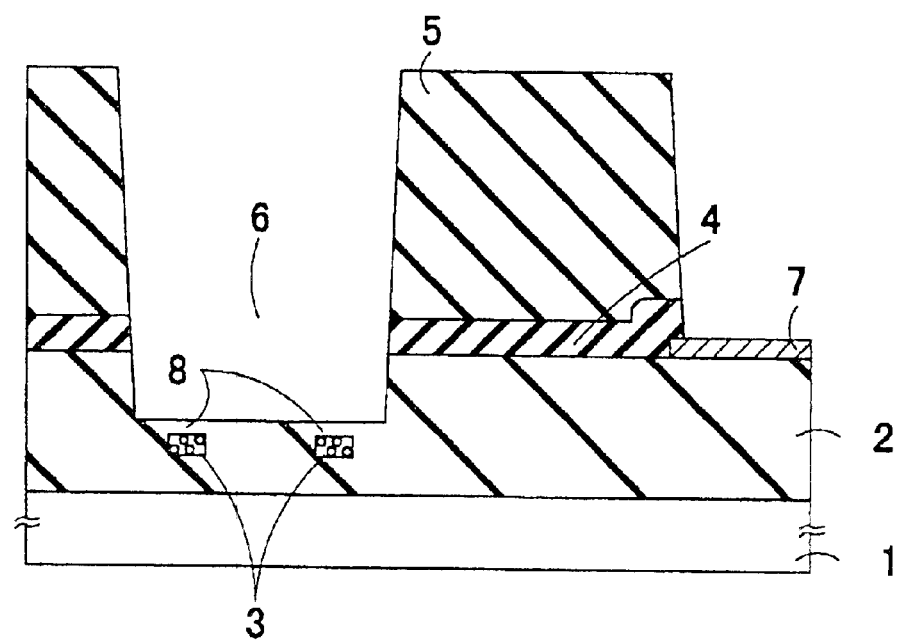
FIG. 17 is a section view showing main portions of a semiconductor integrated circuit device of the conventional art.

As described above, according to the embodiment, it is requested only that the fuse portions 13 are formed by the uppermost metal wiring layer formed on the layer insulating film 12 and an opening is formed in the organic insulating protective film 15 as the opening 16 above the fuse portions 13. Unlike the conventional art such as shown in FIG. 17, therefore, it is not required to etch the layer insulating film 2 in order to form the opening 6 above the fuse portions 3. Consequently, the time period required for forming the opening 16 above the fuse portions 13 can be shortened and the whole production time period can be shortened. Furthermore, the opening 16 above the fuse portions 13 can be formed simultaneously with the opening 19 above the pad electrode 17, and hence a time period dedicated to forming the opening 16 above the fuse portions 13 is not particularly required. Since only the inorganic insulating protective film 14 of 0.1 to 0.8 µm is formed above the fuse portions 13, the cutting off of the fuse portions 13 can be easily performed without increasing the irradiation energy of a laser beam, and high reliability and high productivity can be realized without causing the lowering of the reliability and the reduction of the production yield which are due to the cutting off of the fuse portion. Since the fuse portions 13 are covered with the inorganic insulating protective film 14, the moisture resistance can be improved.

After the step of FIG. 2C, as required, the inorganic insulating protective film 14A may be etched so as to be thinned to a desired thickness to attain the configuration of FIG. 1. In this case, the cutting off of the fuse portions 13 by laser beam irradiation can be performed more easily.

In the embodiment, the fuse portions 13 are formed by the uppermost metal wiring layer on the layer insulating film 12. Therefore, also the problem of the conventional art in that, in a large wafer having a diameter of 8 inches or more, it is difficult to evenly control the remaining thickness of the layer insulating film over the whole face of the wafer does not occur.

In the embodiment, even in a large wafer having a diameter of 8 inches or more, furthermore, the thickness of the inorganic insulating protective film 14 on the fuse portions 13 can be evenly controlled over the face of the wafer. In the configuration of FIG. 2C, the unevenness of the thickness of the inorganic insulating protective film 14 is suppressed to about ±10% or less (about ±0.1 µm or smaller) of the thickness (about 1 µm) of the formed film, so that uniformity over the wafer face can be ensured. In the configuration of FIG. 1 in which the inorganic insulating protective film 14 which has been once formed to have a thickness of about 1 µm is thinned to a thickness of about 0.1 to 0.8 µm, the etching amount for thinning corresponds to about 0.9 to 0.2 µm and the unevenness of the etching can be controlled within about ±10% (within about ±0.09 to 0.02 µm). Therefore, the unevenness of the thickness of the inorganic insulating protective film 14A after the etching can be suppressed within ±0.15 µm which is equal to the square root of the sum of squares of the film thickness unevenness (about ±10%) and the etching unevenness (about ±10%), whereby the film thickness can be uniformly controlled over the wafer face.

In the embodiment described above, a plasma silicon nitride film is used as the inorganic insulating protective film 14. It is matter of course that the inorganic insulating protective film may be configured by a single layer of a silicon nitride film or a silicon oxide film, or a plurality of layers consisting of a combination of these films.

The thickness of the inorganic insulating protective film 14A above the fuse portions 13 is reduced by etching to about 0.1 to 0.8 µm. The invention is not restricted to this. In some cases, for example, the inorganic insulating protective film 14A above the fuse portions 13 may be caused not to remain (i.e., the thickness is 0). It is a matter of course that, even when the inorganic insulating protective film 14A does not exist, there occasionally arises no problem in moisture resistance and properties of a product.

In the case where, as in the embodiment, the fuse portions 13 are configured by the uppermost metal wiring layer, when the inorganic insulating protective film 14 is formed on the fuse portions, the surface of the inorganic insulating protective film 14 covering the edges between the side faces and the upper face of each of the fuse portions 13 are rounded or formed into a semicircular shape. When the inorganic insulating protective film 14 is thinned by a dry etching process as in the case of FIG. 1, the thickness of the inorganic insulating protective film 14A remaining on the side walls of the fuse portions 13 is larger than that of the inorganic insulating protective film 14A remaining on the upper portions of the fuse portions 13 (see an inorganic insulating protective film 39 of FIG. 15). As a result, holding the time period from laser beam irradiation for cutting off the fuse portions to scattering the fuse portions, the inorganic insulating protective film 14 above the fuse portions 13 can be thinned to a thickness at which it can be easily scattered in the upward direction.

[Second Embodiment]

FIG. 4 is a section view showing main portions of a semiconductor integrated circuit device of a second embodiment of the invention. Referring to FIG. 4, 11 denotes a semiconductor substrate, 12 denotes a layer insulating film, 13 denotes fuse portions which are configured by a metal wiring layer, 14 denotes an inorganic insulating protective film, 15 denotes an organic insulating protective film, 16 and 19 denote openings of the organic insulating protective film 15, 17 denotes a pad electrode which is an external lead electrode configured by the metal wiring layer, 18 denotes an opening of the inorganic insulating protective film 14, and 20 denotes an inorganic insulating protective film on the fuse portions 13.

In the semiconductor integrated circuit of the embodiment the fuse portions 13 and the pad electrode 17 are formed by the uppermost metal wiring layer which is formed on the layer insulating film 12, the opening 16 of the organic insulating protective film 15 is disposed above the fuse portions 13, and the upper portion of the pad electrode 17 is opened through the opening 18 of the inorganic insulating protective film 14, and the opening 19 of the organic insulating protective film 15. The inorganic insulating protective film 20 above the fuse portions 13 is formed by thinning the inorganic insulating protective film 14 by etching. The opening 19 of the organic insulating protective film 15 and disposed above the pad electrode 17 is formed in a range which is wider than the opening 18 of the inorganic insulating protective film 14, and in the region of the pad electrode 17 and its vicinity.

Figure 5A:
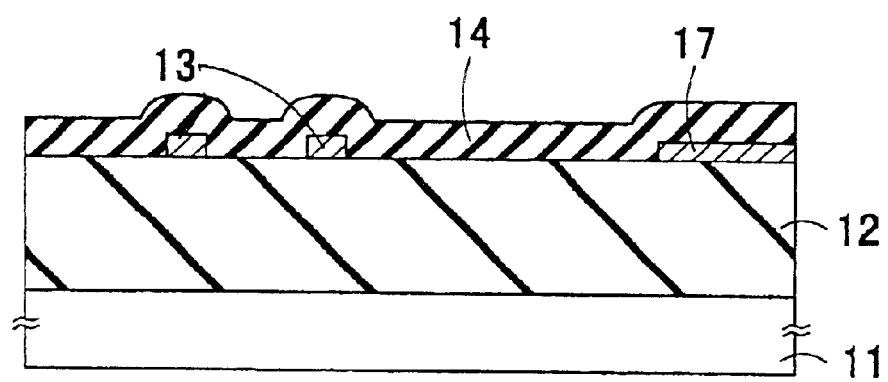
FIGS. 5A to 5E are section views showing steps of a method of producing the semiconductor integrated circuit device of the second embodiment of the invention.
Figure 5B:
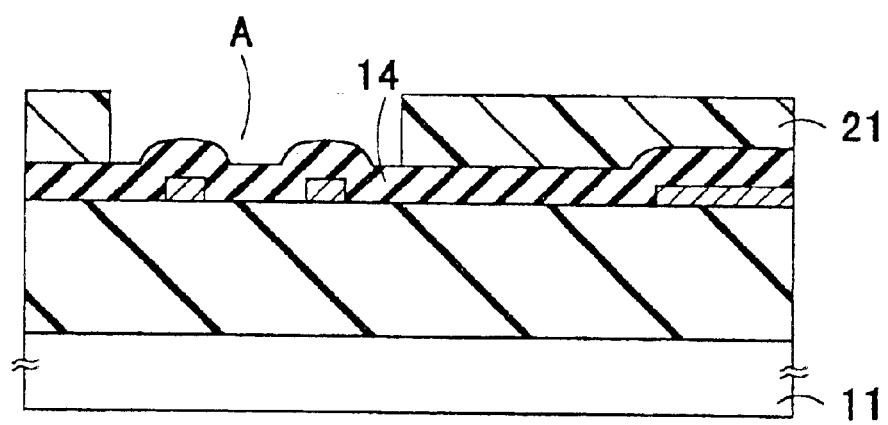
Figure 5C:
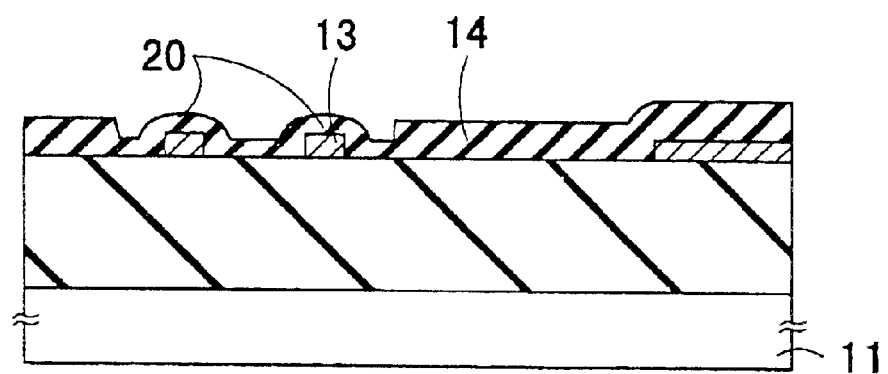
Figure 5D:
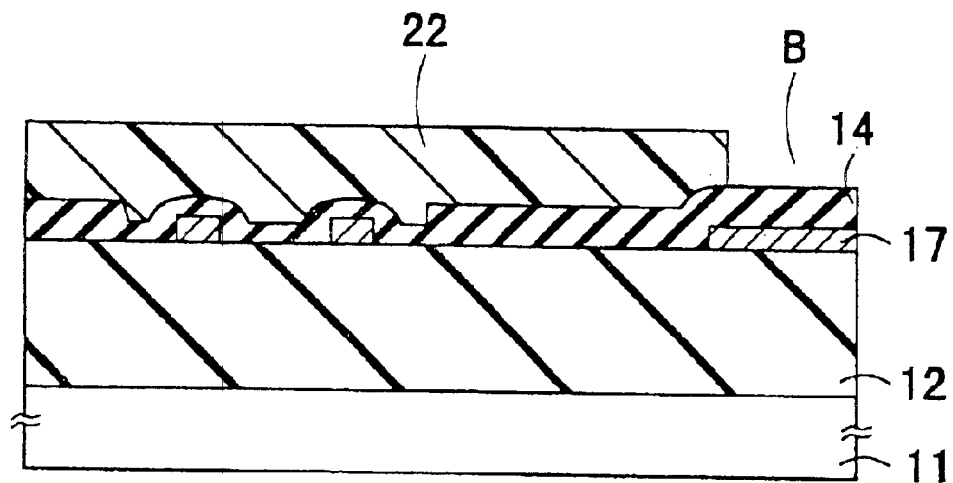
Figure 5E:
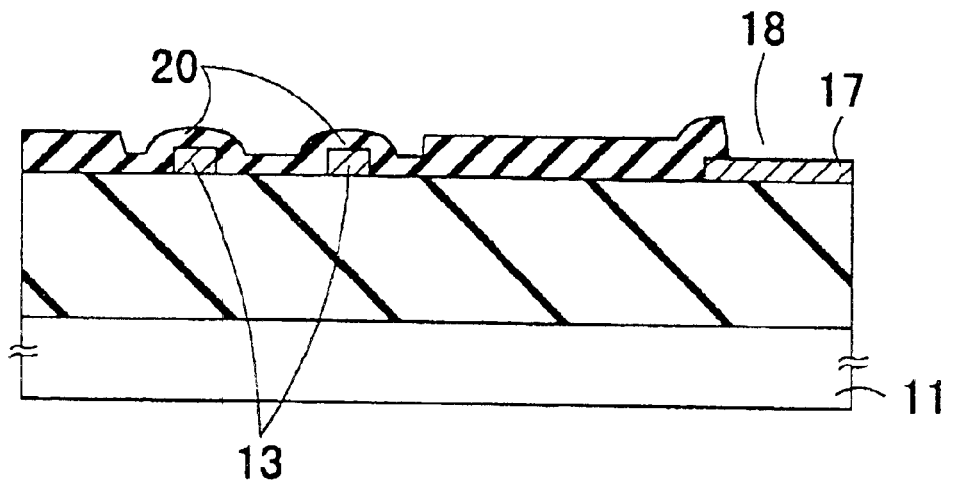
Figure 6:
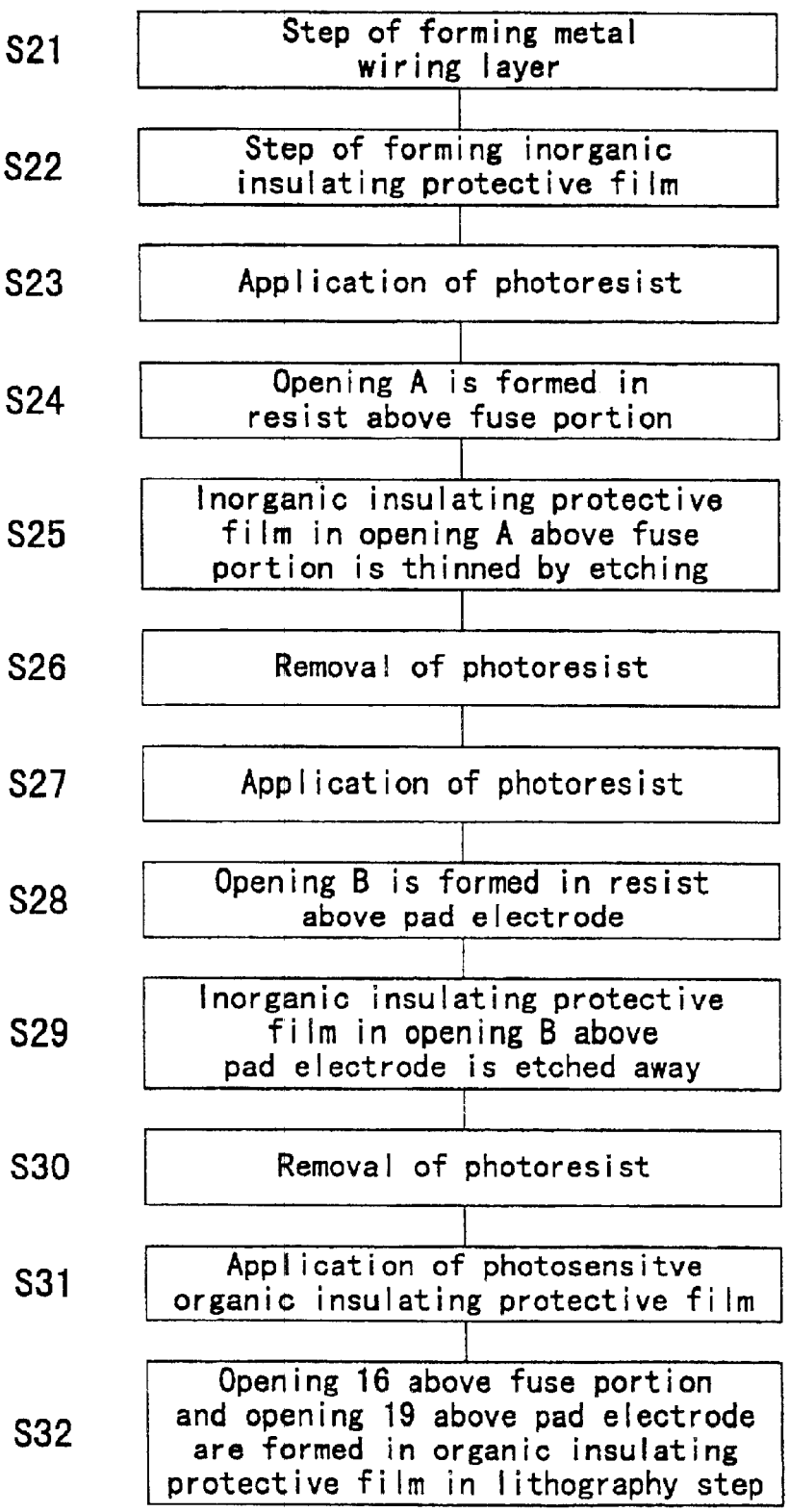
FIG. 6 is a flowchart showing the method of producing the semiconductor integrated circuit device of the second embodiment of the invention.

FIGS. 5A to 5E are section views showing steps of a method of producing the semiconductor integrated circuit device of the second embodiment of the invention, and FIG. 6 is a flowchart showing steps of the production method. Hereinafter, the production method will be described with reference to FIGS. 5A to 5E and 6.

Elements formed on the semiconductor substrate 11 are connected to one another by multi wiring layers (not shown). On the layer insulating film 12 of the multi wiring layers, the fuse portions 13 and the pad electrode 17 are formed by the uppermost metal wiring layer. The inorganic insulating protective film 14 such as a plasma silicon nitride film is formed at a thickness of about 1 μm on the fuse portions and the pad electrode (FIG. 5A, and steps S21 and S22 of FIG. 6).

Thereafter, a photoresist 21 is applied, and an opening A is formed in the resist above the fuse portions 13 (FIG. 5B, and steps S23 and S24 of FIG. 6). Then, the inorganic insulating protective film 14 in the opening A above the fuse portions 13 is thinned by a usual dry etching process. The thinning of the inorganic insulating protective film 14 below the opening A is performed so that the inorganic insulating protective film 20 above the fuse portions 13 is thinned to a thickness of about 0.1 to 0.8 μm. Thereafter, the photoresist 21 is removed away (FIG. 5C, and steps S25 and S26 of FIG. 6).

Next, a photoresist 22 is applied, and an opening B is formed in the resist above the pad electrode 17 (FIG. 5D, and steps S27 and S28 of FIG. 6). Then, a usual dry etching process is performed, so that the inorganic insulating protective film 14 in the opening B above the pad electrode 17 is removed away by selective etching, thereby forming the opening 18. At this time, the inorganic insulating protective film 20 above the fuse portions 13 which has been already thinned is not removed away by the etching. Thereafter, the photoresist 22 is removed away (FIG. 5E, and steps S29 and S30 of FIG. 6).

Next, the organic insulating protective film 15 which is photosensitve is applied at a thickness of about 10 μm over the whole face, and then patterned in a lithography step to form the opening 16 above the fuse portions 13, and the opening 19 above the pad electrode 17 (FIG. 4, and steps S31 and S32 of FIG. 6). Usually, a photosensitve polyimide film or the like is used as the organic insulating protective film 15. The kind of the film is not restricted to this. Although the case where the thickness is about 10 μm has been described, it is a matter of course that the thickness is not restricted to this value.

Thereafter, the thickness of the inorganic insulating protective film 20 on the fuse portions 13 is measured by a usual measuring instrument. If required as a result of the measurement, the inorganic insulating protective film exposed through the openings 16 and 19 is etched to adjust the thickness of the inorganic insulating protective film 20 above the fuse portions 13. It is a matter of course that, if the adjustment of the thickness of the inorganic insulating protective film 20 is not necessary, it is not required to take the trouble to perform the etching.

As described above, according to the embodiment, when the inorganic insulating protective film is not etched after the organic insulating protective film 15 is patterned to form the openings 16 and 19, the thickness of the inorganic insulating protective film 23 exposed in the opening 19 is equal to that of the inorganic insulating protective film 14 below the organic insulating protective film 15, and the inorganic insulating protective film 23 exposed in the opening 19 corresponds to the inorganic insulating protective film above the periphery of the pad electrode 17 and a wiring (not shown) between an internal wiring and the pad electrode 17, so that the thickness is not reduced. This advantageously operates on the moisture resistance of a semiconductor chip. Furthermore, it is requested only that the fuse portions 13 are formed by the uppermost metal wiring layer formed on the layer insulating film 12 and an opening is formed in the organic insulating protective film 15, as the opening 16 above the fuse portions 13. Unlike the conventional art such as shown in FIG. 17, therefore, it is not required to etch the layer insulating film 2 in order to form the opening 6 above the fuse portions 3. Consequently, the time period required for forming the opening 16 above the fuse portions 13 can be shortened and the whole production time period can be shortened.

In the step of FIG. 5C (step S25 of FIG. 6), moreover, the etching time period for adjusting the thickness of the inorganic insulating protective film 20 above the fuse portions 13 can be set separately from or independent from the area factor of the pad electrode 17 with respect to the opening. The metals (such as aluminum) constituting the pad electrode 17 are not exposed to an etching gas. Therefore, reduction of the thickness of the pad electrode 17 itself does not occur, and no metal depositions are produced during the etching process, with the result that the etching for adjusting the film thickness can be stably performed.

The etching for adjusting the thickness of the inorganic insulating protective film 20 is previously performed. Even when, in the subsequent formation of the openings 16 and 19 by patterning in a lithography step and then heat-curing the organic insulating protective film 15 (in which photosensitve polyimide is usually used), a very thin organic insulating protective film (polyimide film) remains, therefore, the etching does not exert an influence on the thickness of the inorganic insulating protective film 20. As a result, the inorganic insulating protective film 20 in which the thickness is reduced is formed above the fuse portions 13, and hence the cutting off of the fuse portions 13 can be easily performed without increasing the irradiation energy of a laser beam, and high reliability and high productivity can be realized without causing the lowering of the reliability and the reduction of the production yield which are due to the cutting off of the fuse portions 13. Since the fuse portions 13 are covered with the inorganic insulating protective film 20, the moisture resistance can be improved.

In the embodiment, the fuse portions 13 are formed by the uppermost metal wiring layer on the layer insulating film 12. Therefore, also the problem of the conventional art in that, in a large wafer having a diameter of 8 inches or more, it is difficult to evenly control the remaining thickness of the layer insulating film over the whole face of the wafer does not occur.

In the embodiment, in a large wafer having a diameter of 8 inches or more, furthermore, the thickness of the inorganic insulating protective film 20 on the fuse portions 13 can be evenly controlled over the face of the wafer. In the configuration of FIG. 4, the unevenness of the thickness of the inorganic insulating protective film 14 is suppressed to about ±10% or less (about ±0.1 μm or smaller) of the thickness (about 1 μm) of the formed film, so that uniformity over the wafer face can be ensured. The etching amount for thinning the inorganic insulating protective film 20 on the fuse portions 13 to about 0.1 to 0.8 μm corresponds to about 0.9 to 0.2 μm and the unevenness of the etching can be controlled within about ±10% (within about ±0.09 to 0.02 μm). Therefore, the unevenness of the thickness of the inorganic insulating protective film 20 can be suppressed within ±0.15 μm which is equal to the square root of the sum of squares of the film thickness unevenness (about ±10%) and the etching unevenness (about ±10%), whereby the thickness of the inorganic insulating protective film 20 on the fuse portions 13 can be uniformly controlled over the wafer face.

In the embodiment, the case where the inorganic insulating protective film 14 is formed at a thickness of about 1 μm has been described. When the layer insulating film 12 has an excellent flatness, there occasionally arises no problem in moisture resistance and properties of a product. In such a of course, the inorganic insulating protective film 14 may be made thinner than about 1 µm.

[Third Embodiment]

Figure 7:
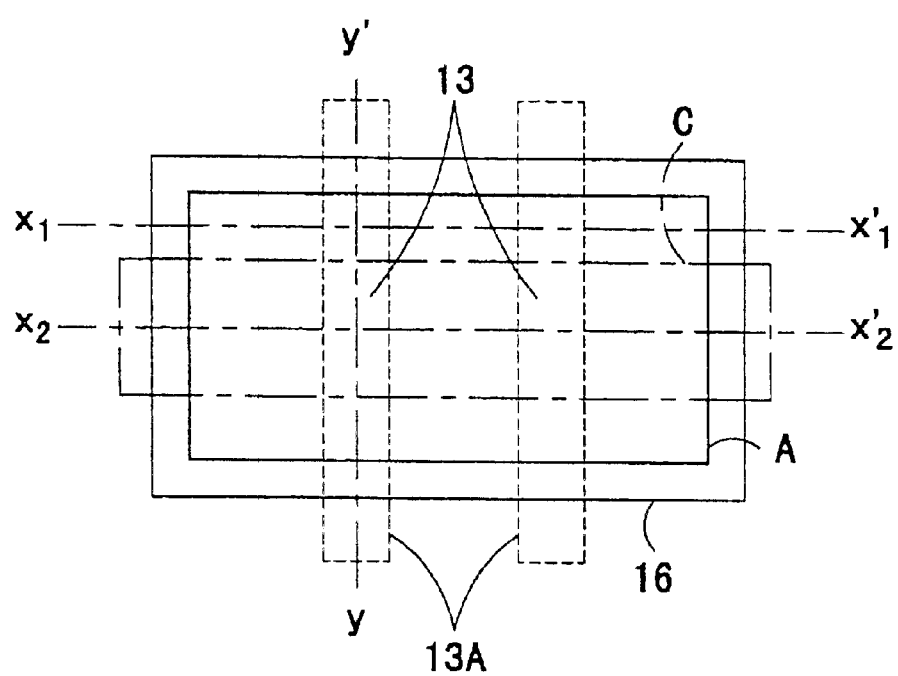
FIG. 7 is a plan view showing main portions of a semiconductor integrated circuit device of a third embodiment of the invention.
Figure 8A:
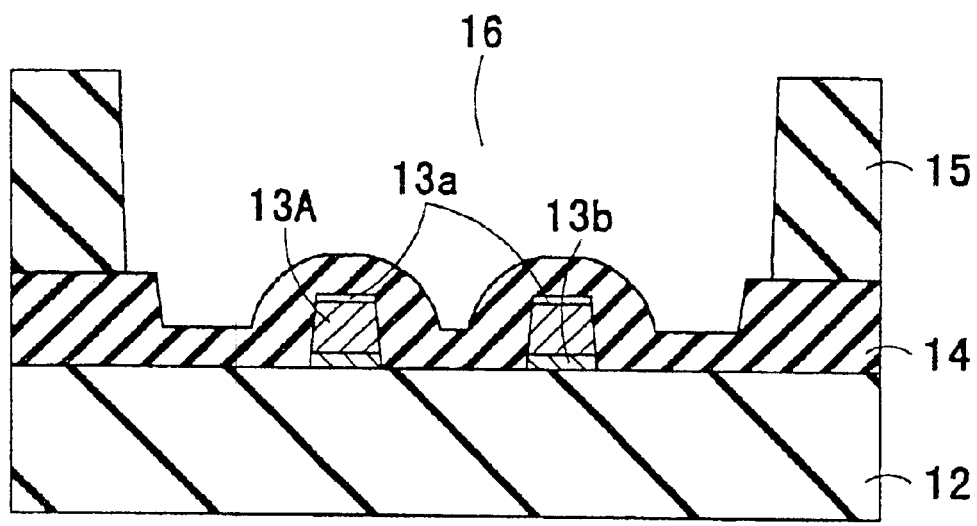
FIGS. 8A to 8C are section views showing main portions of the semiconductor integrated circuit device of the third embodiment of the invention.
Figure 8B:
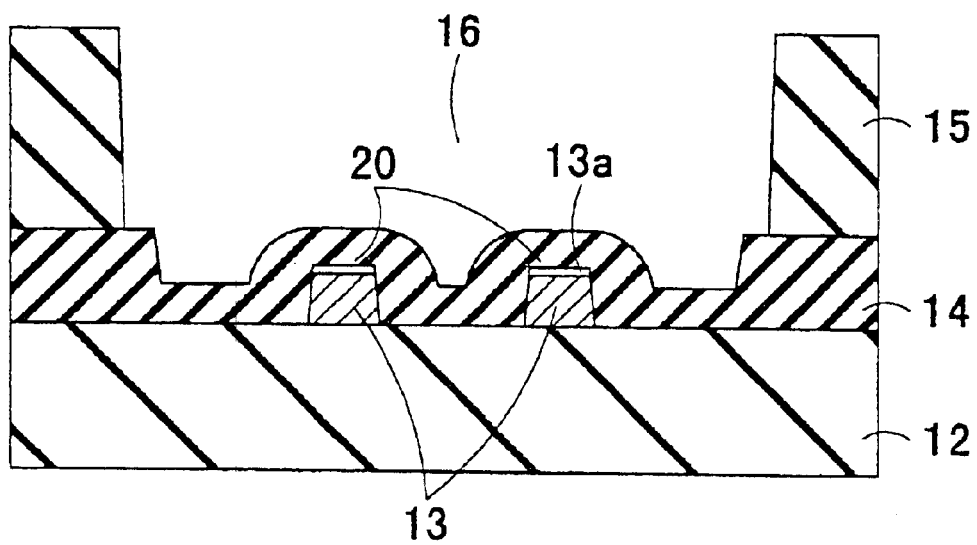
Figure 8C:
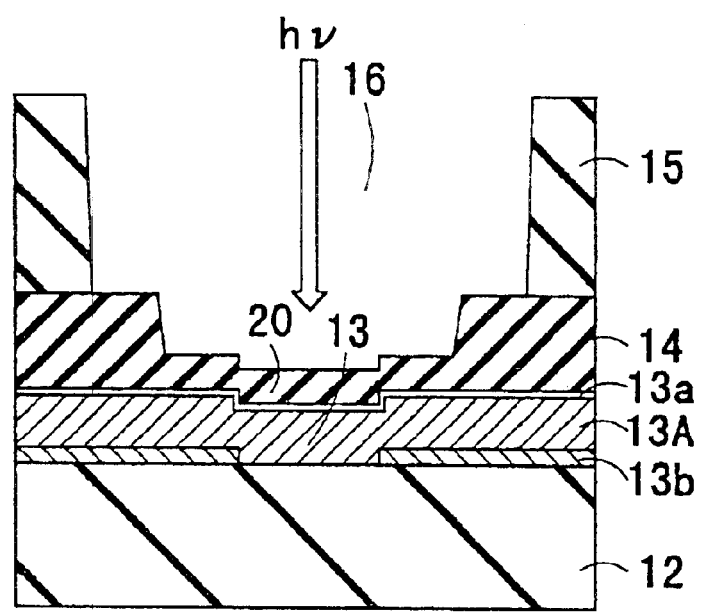

FIG. 7 is a plan view showing arrangement of main portions of a semiconductor integrated circuit device of a third embodiment of the invention, and FIG. 8A, FIG. 8B, and FIG. 8C are section views respectively taken along lines $x_1$–$x_1'$, $x_2$–$x_2'$, and y—y' of FIG. 7. Referring to FIGS. 7 and 8A to 8C, 12 denotes a layer insulating film which is formed on a semiconductor substrate (not shown), 13 denotes fuse portions, 13A denotes a main conducting metal layer constituting the fuse portions 13, 13a denotes an antireflection film, 13b denotes a barrier metal layer, 14 denotes an inorganic insulating protective film, 15 denotes an organic insulating protective film, 16 denotes an opening of the organic insulating protective film 15, and 20 denotes an inorganic insulating protective film on the fuse portions 13.

The semiconductor integrated circuit device of the embodiment shows an example in which the fuse portions 13 and a pad electrode (not shown) are formed by the uppermost metal wiring layer formed on the layer insulating film 12. A via hole (not shown) is formed in the layer insulating film 12, and the barrier metal layer 13b for improving the adhesiveness with a lower wiring and avoiding punchthrough of a plug electrode metal or the like is then formed. As the barrier metal layer 13b, a compact metal layer consisting of a single or multi layer of a metal such as titanium nitride (TiN), titanium (Ti), or tungsten nitride (WN) is formed at a thickness of about 100 nm. After the barrier metal layer 13b is formed, a plug electrode (not shown) of a metal such as tungsten is formed in the via hole, and the barrier metal layer 13b in the region of the opening C (see FIG. 9D) of FIG. 7 is removed away by selective etching. On the barrier metal layer, the fuse portions 13 are formed by the uppermost metal wiring layer. The main conducting metal layer 13A of the fuse portions 13 is made mainly of aluminum or an alloy of aluminum and copper. As the antireflection film 13a which prevents light of exposure such as potassium fluoride (KrF: 248 nm) laser or i line (365 nm) serving as an exposure light source from reflecting, in order to facilitate fine patterning in a lithography step, a film of titanium nitride (TiN) which is frequently used for the purpose in a usual process is formed on the metal layer at a thickness of 10 to 50 nm. Such an exposure light source is often employed in a stepper for performing fine patterning.

As shown in FIG. 8A, the barrier metal layer 13b is formed below the main conducting metal layer 13A, and the antireflection film 13a above the main conducting metal layer. Before the formation of the main conducting metal layer 13A, however, the barrier metal layer 13b in the region of the opening C of FIG. 7 is previously selective etched, and, as shown in FIG. 8B, the barrier metal layer 13b is formed below the fuse portions 13.

The opening 16 of the organic insulating protective film 15 is disposed above the fuse portions 13, and the upper portion of the pad electrode (not shown) is opened through an opening (not shown) of the inorganic insulating protective film 14, and an opening (not shown) of the organic insulating protective film 15. In the case where the inorganic insulating protective film 20 on the fuse portions 13 is to be thinned in order to ensure the cutting off of the fuse portions, the inorganic insulating protective film 14 exposed through the opening 16 of the organic insulating protective film is thinned by performing selective etching thereon as required.

As shown in FIG. 8C, the area where the barrier metal layer 13b does not exist is convergingly irradiated with laser beam (hv) pulses to heat the fuse portions 13 to blow up, thereby fusing off the fuse portions. At this time, also the antireflection film 13a is simultaneously fused off. Furthermore, the inorganic insulating protective film 20 is scattered at the same time when the fuse portions 13 are scattered by explosion. Since the barrier metal layer 13b having a high melting point does not exist below the fuse portions 13, the cutting off of the fuse portions can be performed more surely. Since the opening (not shown) of the organic insulating protective film 15 and disposed above the pad electrode (not shown) is formed in a range which is wider than the opening (not shown) of the inorganic insulating protective film 14, and in the region of the pad electrode (not shown) and its vicinity. The pad electrode and its vicinity can be configured in the same manner as the cases of FIGS. 1 and 4.

In the above, the example in which the fuse portions 13 are formed by the uppermost metal wiring layer has been described. The manner of forming the fuse portions is not restricted to this. It is a matter of course that the fuse portions may be formed by a wiring layer which is lower than the uppermost layer by one or two levels. This may be performed because of the following reason. When the barrier metal layer 13b exists below the fuse portions 13, in the case where the fuse portions 13 are formed by a wiring layer which is lower than the uppermost layer by one or two levels, the layer insulating film layer is flatter as compared with the case where the fuse portions 13 are formed by the uppermost metal wiring layer, and hence the possibility that the barrier metal layer remains in the cutting off of the fuse portions is larger, resulting in an increased possibility of occurrence of a cutting failure. In the embodiment, since the barrier metal layer 13b does not exist, the cutting off can be performed more surely.

Figure 9C:
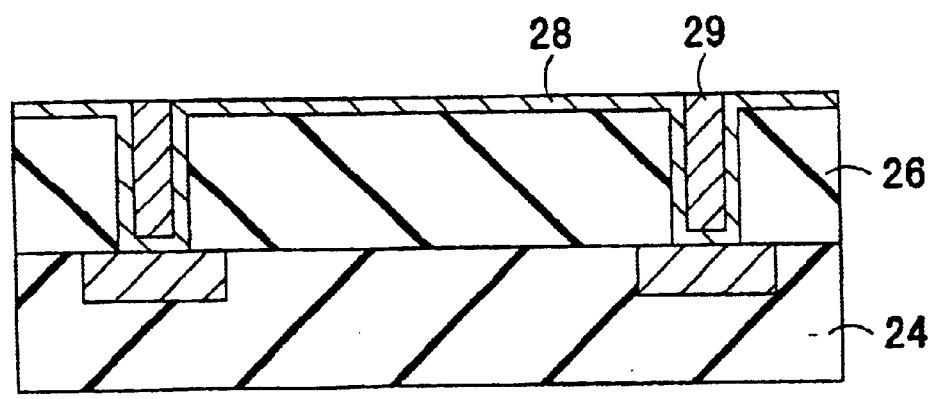
Figure 9D:
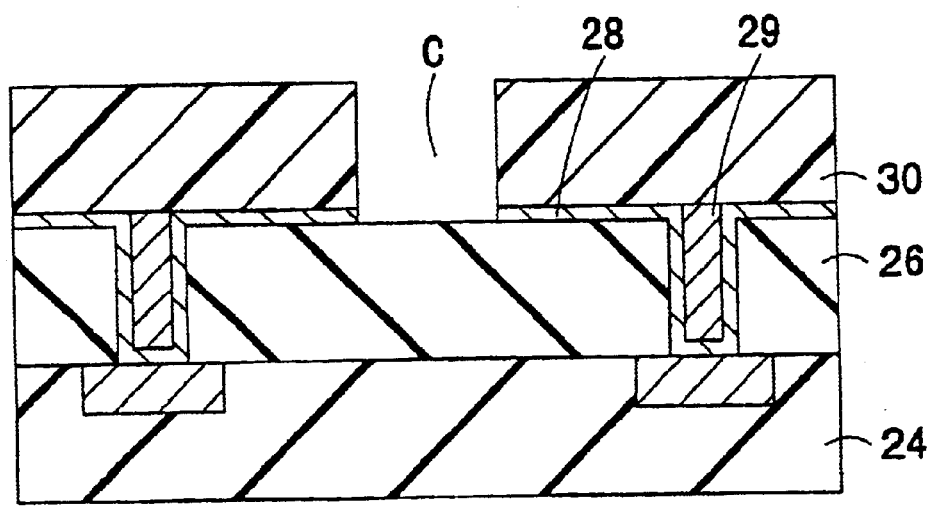
Figure 9E:
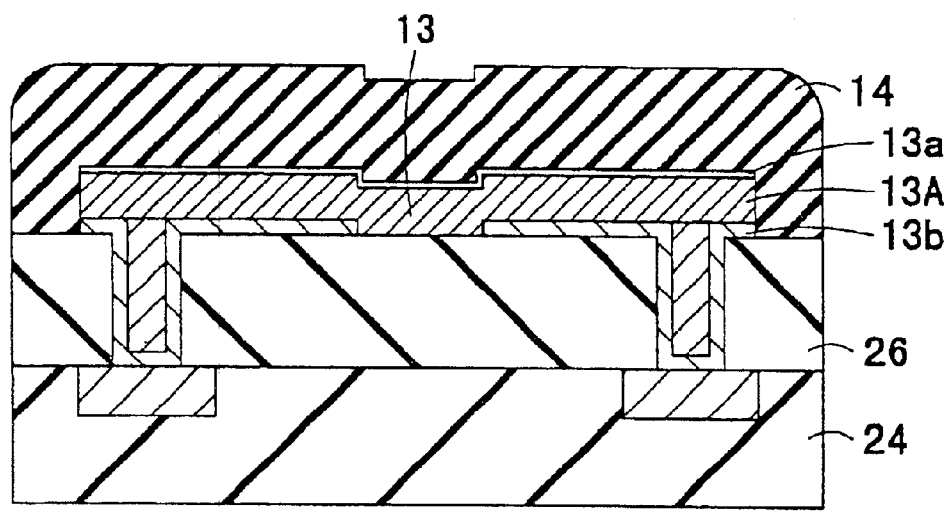
Figure 9F:
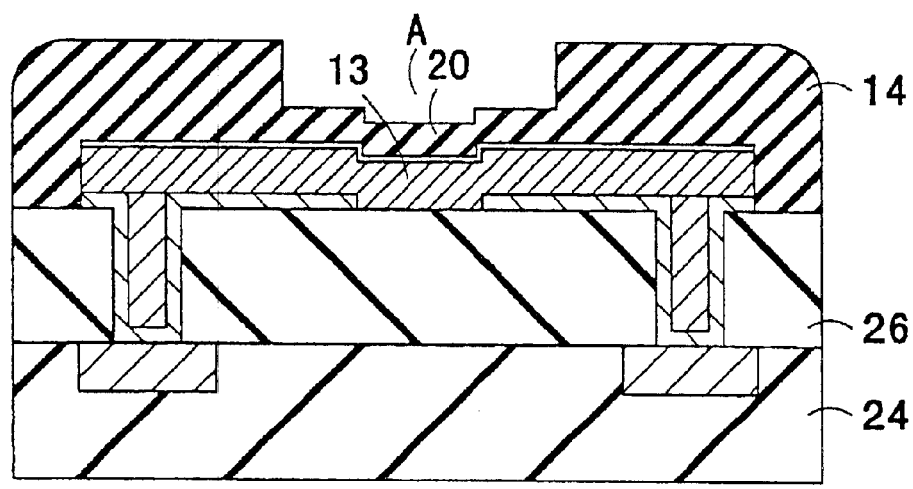
Figure 9G:
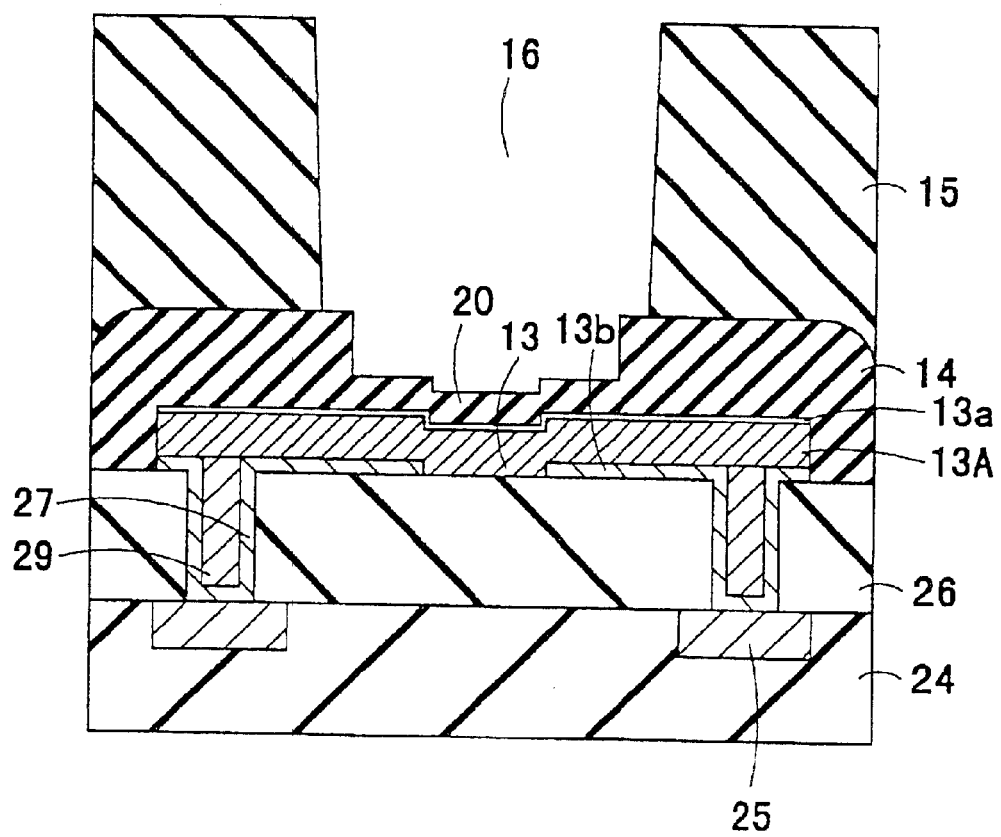
Figure 10:
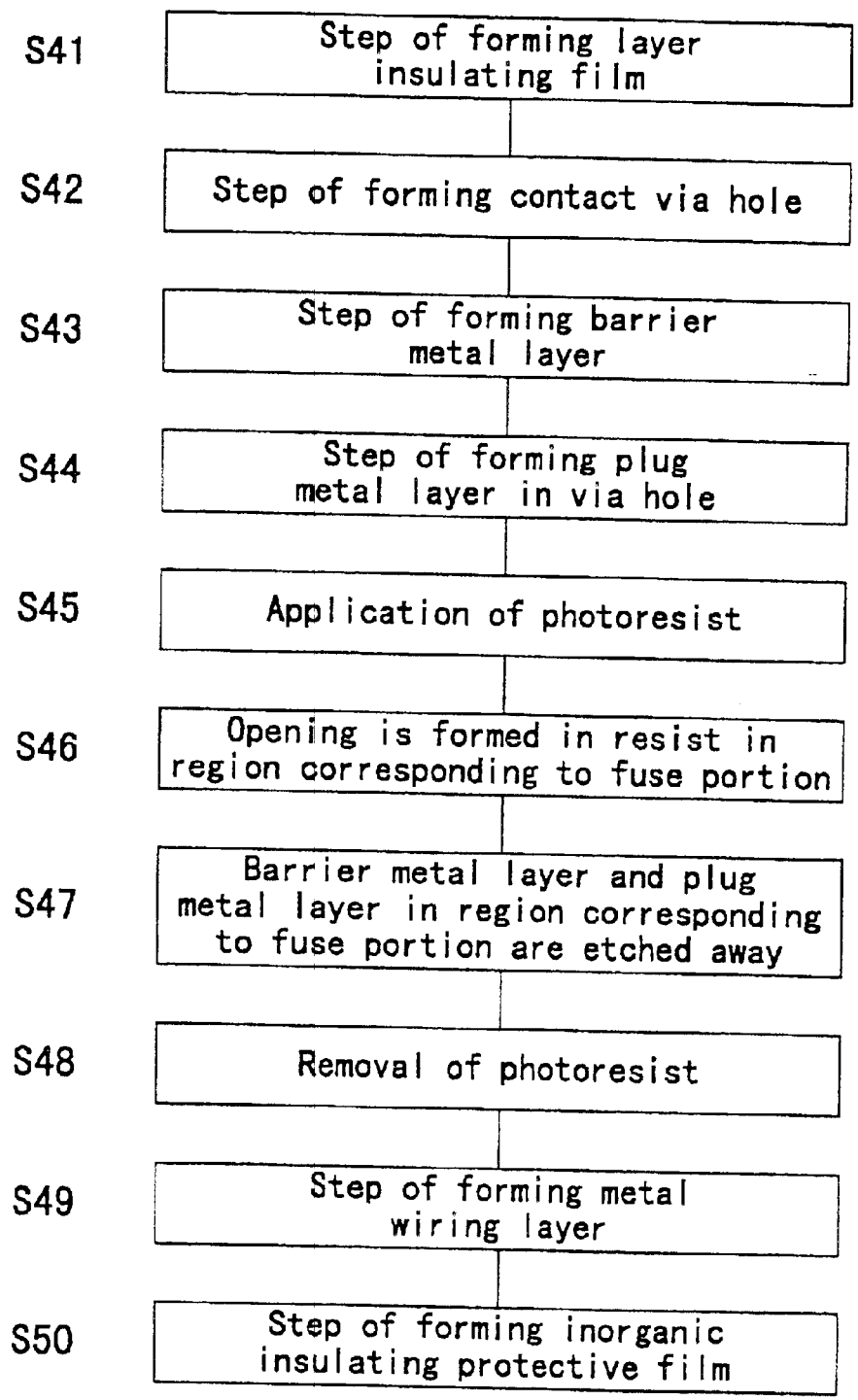
FIG. 10 is a flowchart showing the method of producing the semiconductor integrated circuit device of the third embodiment of the invention.

FIGS. 9A to 9G are section views showing steps of a method of producing the semiconductor integrated circuit device of the third embodiment of the invention, and FIG. 10 is a flowchart showing steps of the production method. Hereinafter, the production method will be described with reference to FIGS. 9A to 9G, and 10.

Referring to FIG. 9A, elements formed on the semiconductor substrate 11 are connected to one another by multi wiring layers (not shown) and a plug metal (not shown) which are formed in a layer insulating film 24. Wiring trenches are formed in the surface of the layer insulating film 24, and an embedded wiring layer 25 is formed in the trenches. Thereafter, the subsequent layer insulating film 26 is formed over the whole face (step S41 of FIG. 10). In the above, the example in which the wiring layer 25 is embedded into the trenches has been described. The manner of forming the wiring layer is not restricted to this. Alternatively, of course, the wiring layer 25 may be formed on the surface of a flattened layer insulating film 24, the subsequent layer insulating film 26 may be formed over the whole face, and the surface may be then flattened.

Next, via holes 27 for contacting are formed in the layer insulating film 26 above the wiring layer 25 to be connected (FIG. 9B, and step S42 of FIG. 10). A barrier metal layer 28 for improving the adhesiveness with the lower wiring layer 25 and avoiding punchthrough of the plug electrode metal or the like is then grown over the whole face of the semiconductor substrate by the CVD method which is usually employed. As the barrier metal layer 28, a compact metal layer consisting of a single or multi layer of a metal such as titanium nitride (TiN), titanium (Ti), or tungsten nitride (WN) is formed at a thickness of about 100 nm. Thereafter, a plug electrode 29 of a metal such as tungsten is grown by a usual selective growing method in the via holes 27 (FIG. 9C, and steps S43 and S44 of FIG. 10).

Next, a photoresist 30 is applied to the whole face, and the opening C is formed in the resist in the region corresponding to the fuse portions by usual mask exposure and development processes. In the opening C of the photoresist 30, thereafter, the barrier metal layer 28, and the metal layer for the plug electrode 29 which possibly remains in a small amount are removed away by selective etching (FIG. 9D, and steps S45 to S47 of FIG. 10).

As shown in FIG. 9E, the photoresist 30 is then removed away (step S48 of FIG. 10), the main conducting metal layer 13A which is the uppermost layer is thereafter formed, and the antireflection film 13a is formed on the main conducting metal layer. Next, the fuse portions 13 are formed by a usual lithography etching technique, simultaneously with the pad electrode (not shown) which is an external lead electrode (step S49 of FIG. 10). At this time, the barrier metal layer 28 is etched into the same shape as the antireflection film 13a and the main conducting metal layer 13A, to be formed as the barrier metal layer 13b. The main conducting metal layer 13A of the fuse portions 13 is made mainly of aluminum or an alloy of aluminum and copper. The antireflection film 13a is formed above the metal layer in order to facilitate fine patterning in a lithography step. The antireflection film 13a prevents light of exposure such as potassium fluoride (KrF: 248 nm) laser or i line (365 nm) serving as an exposure light source from reflecting, and a film of titanium nitride (TiN) which is frequently used for the purpose in a usual process is formed at a thickness of 10 to 50 nm. Such an exposure light source is often employed in a stepper for performing fine patterning.

As the inorganic insulating protective film 14, thereafter, a plasma silicon nitride film is formed at a thickness of about 1 $\mu$m (step S50 of FIG. 10). The inorganic insulating protective film 14 is not restricted to a plasma silicon nitride film. It is matter of course that the inorganic insulating protective film may be configured by a single layer of a silicon oxide film ($SiO_2$ film), a silicon oxynitride film (SiON film), or a plasma silicon nitride film which is frequently used in a usual process, or a plurality of layers consisting of a combination of these films.

Next, a photoresist (not shown) is applied onto the inorganic insulating protective film 14, the photoresist above the fuse portions 13 is opened, and the inorganic insulating protective film 20 in the opening A corresponding to the opening is thinned to a thickness of about 0.1 to 0.8 $\mu$m by usual etching (FIG. 9F). The thinning of the inorganic insulating protective film 20 enables the fuse portions 13 to be fused off stably and surely by a smaller laser energy than that in the case where the inorganic insulating protective film 20 has a large thickness, so that the layer insulating film 26 and the like below the fuse portions 13 can be less damaged.

Thereafter, the inorganic insulating protective film 14 on the pad electrode (not shown) which is an external lead electrode is opened (not shown), and a photosensitve polyimide film serving as the organic insulating protective film 15 are applied and baked to be formed as a film of a thickness of about 10 $\mu$m. The opening 16 on the fuse portions 13, and the opening (not shown) on the pad electrode (not shown) serving as an external lead electrode are formed in the organic insulating protective film 15 by an exposure development process, and the wafer is then subjected to a hardening process in a curing oven (FIG. 9G).

The thinning adjustment of the thickness of the inorganic insulating protective film 20 above the fuse portions 13 is not restricted to the previous etching process. It is a matter of course that, after the opening and curing processes are performed on the organic insulating protective film 15, the thinning adjustment may be further performed by etching.

In the embodiment, the case where the fuse portions 13 are formed by the uppermost metal wiring layer has been described as an example. In this case, therefore, the steps which have been described in the first and second embodiments may be applied to those subsequent to the formation of the inorganic insulating protective film 14.

In the above, the example in which the fuse portions 13 are formed by the uppermost metal wiring layer has been described. The fuse portions may be formed by a wiring layer which is lower than the uppermost layer by one level.

[Fourth Embodiment]

Figure 11A:
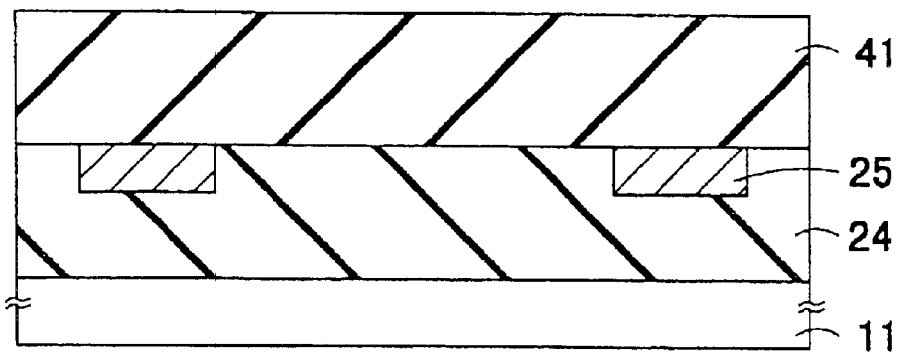
FIGS. 11A to 11E are section views showing steps of a method of producing the semiconductor integrated circuit device of a fourth embodiment of the invention.
Figure 11B:
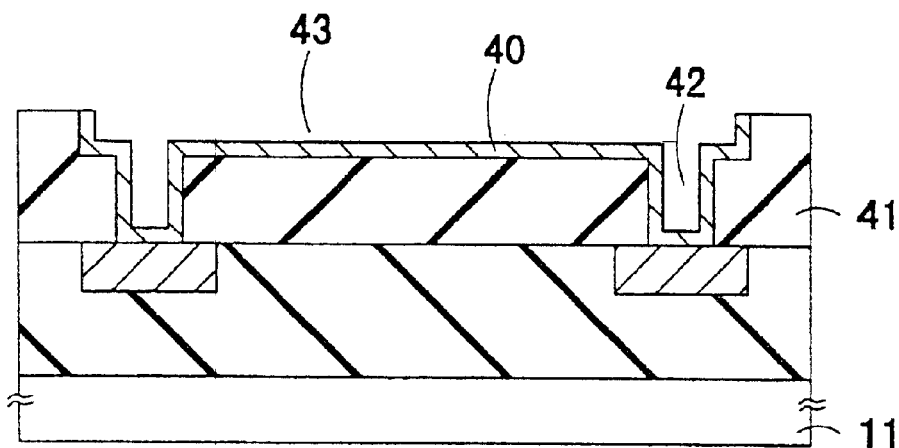
Figure 11C:
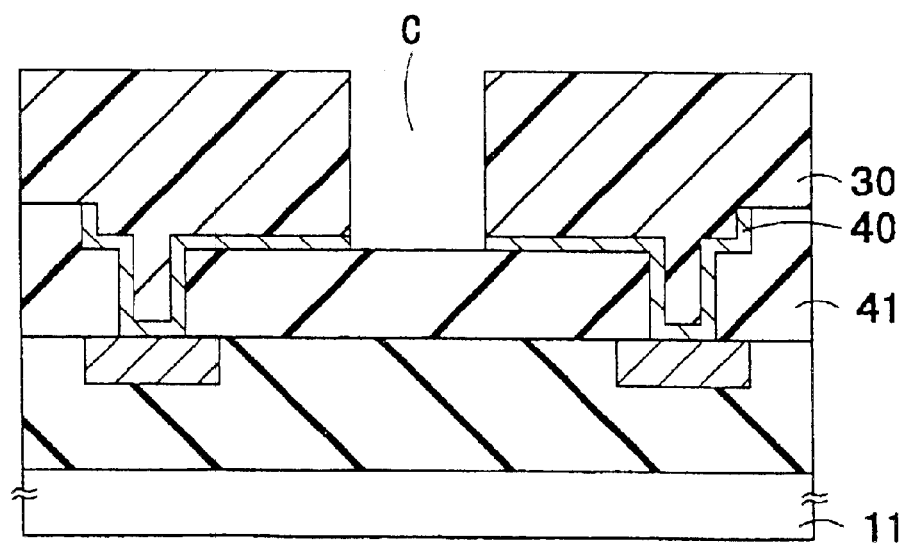
Figure 11D:
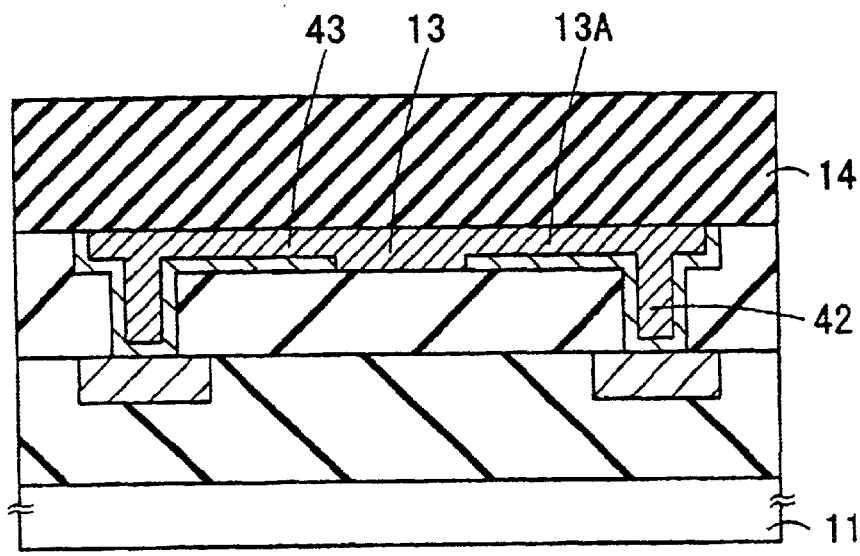
Figure 11E:
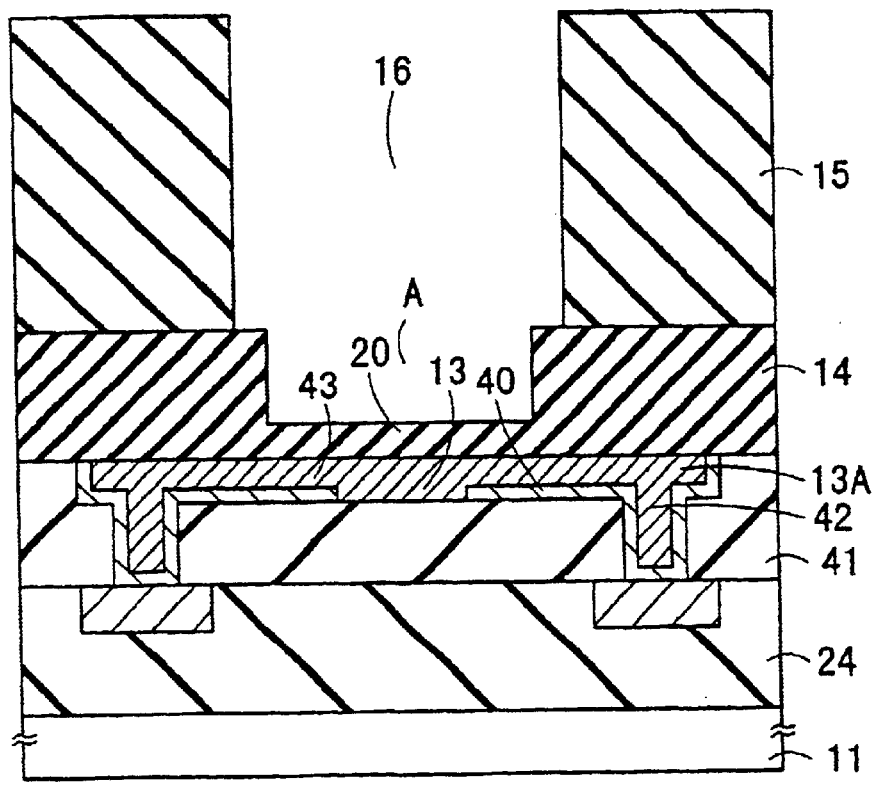

FIGS. 11A to 11E are section views showing steps of a method of producing the semiconductor integrated circuit device of a fourth embodiment of the invention. FIG. 11E is a section view showing main portions of the completed semiconductor integrated circuit device of the embodiment. Referring to FIG. 11E, 11 denotes a semiconductor substrate, 24 and 41 denote layer insulating films, 13 denotes a fuse portion which is configured by a main conducting metal wiring layer 13A, 14 denotes an inorganic insulating protective film, 15 denotes an organic insulating protective film, 16 denotes an opening of the organic insulating protective film 15, 20 denotes an inorganic insulating protective film on the fuse portion 13, 40 denotes a barrier metal layer, 42 denotes via holes, and 43 denotes a wiring trench.

In the semiconductor integrated circuit device of the embodiment, an example is shown in which the fuse portion 13 and a pad electrode (not shown) are configured by the uppermost metal wiring layer that is formed in the trench 43 of the layer insulating film 41 as shown in FIG. 11E. The via holes 42 and the trench 43 are formed in the layer insulating film 41 so as to attain a so-called Dual Demascene wiring structure. The barrier metal layer 40 for improving the adhesiveness with a lower wiring and avoiding punch-through is formed. As the barrier metal layer 40, a compact metal layer consisting of a single or multi layer of a metal such as titanium nitride (TiN), titanium (Ti), or tungsten nitride (WN) is formed at a thickness of about 100 nm. After the barrier metal layer 40 is formed, the barrier metal below the fuse portion 13 is removed away by selective etching, and copper or the like serving as the main conducting metal layer 13A is formed in the via holes 42 and the trench 43 by a technique such as plating which is often employed in a usual process. The inorganic insulating protective film 14 and the organic insulating protective film 15 are formed on the main conducting metal layer 13A and the layer insulating film 41. Above the fuse portion 13, the inorganic insulating protective film 20 in the region of an opening A is thinned, and an opening 16 is formed in the organic insulating protective film 15.

The embodiment is different from the third embodiment in that the metal wiring layer forming the fuse portion 13 has the Dual Demascene wiring structure as described above, and that an antireflection film is not formed on the main conducting metal layer 13A. In the same manner as the third embodiment, the barrier metal layer 40 having a high melting point does not exist below the fuse portion 13, and hence the cutting off of the fuse portion can be performed more surely. In the above, the example in which the fuse is configured by a copper wiring has been described. The fuse is not restricted to this, and may be configured by an embedded wiring of aluminum or another metal. It is a matter of course that the fuse portion 13 is not restricted to the uppermost metal wiring layer.

Figure 12:
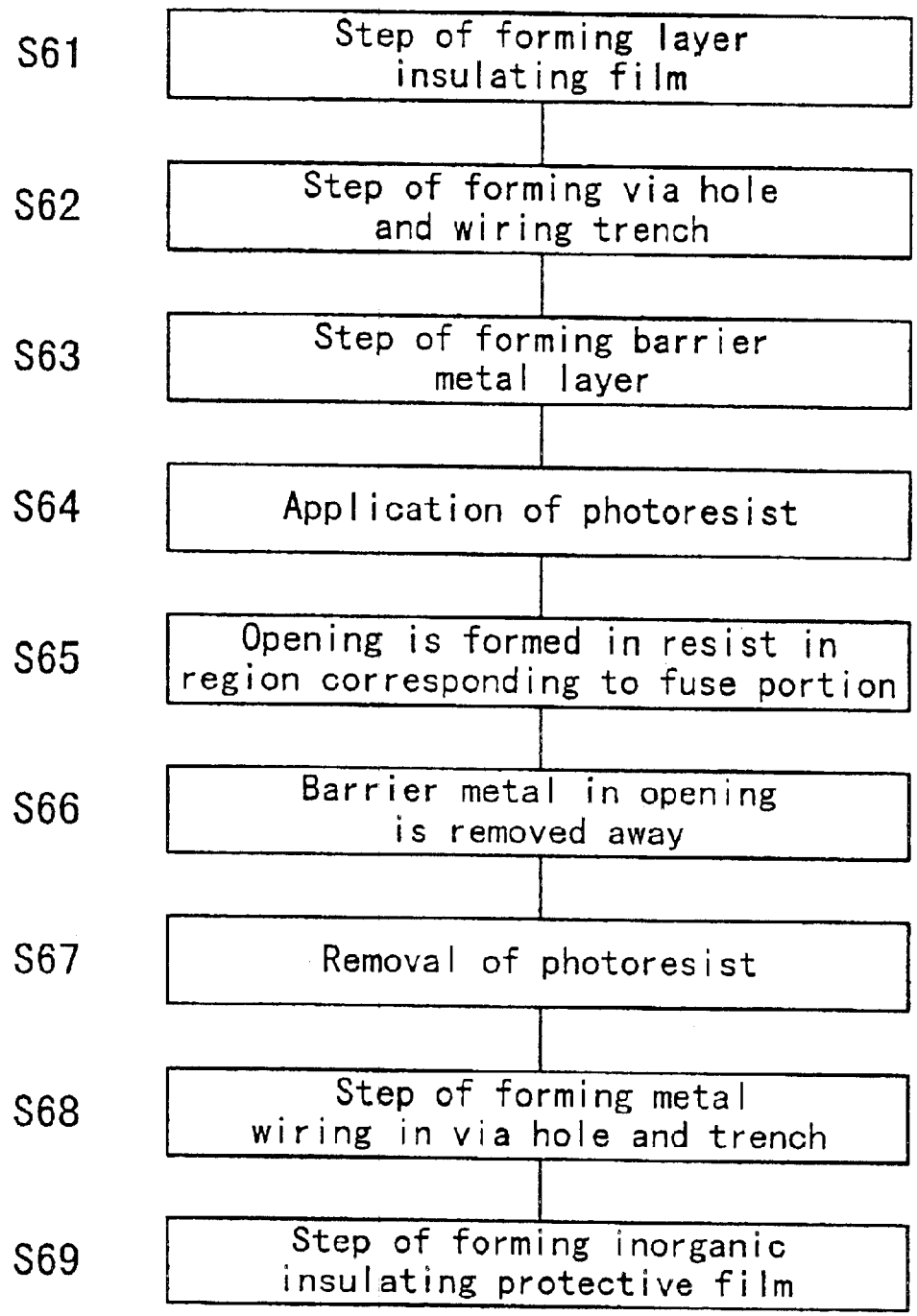
FIG. 12 is a flowchart showing the method of producing the semiconductor integrated circuit device of the fourth embodiment of the invention.

FIG. 12 is a flowchart showing steps of the production method in the embodiment. Hereinafter, the method of producing the main portions will be described with reference to FIGS. 11A to 11E and 12.

Referring to FIG. 11A, elements formed on the semiconductor substrate 11 are connected to one another by multi wiring layers (not shown) and a plug metal (not shown) which are formed in a layer insulating film 24. Wiring trenches are formed in the surface of the layer insulating film 24, and an embedded wiring layer 25 is formed in the trenches. Thereafter, the subsequent layer insulating film 41 is formed over the whole face (step S61 of FIG. 12).

Next, the via holes 42 and the wiring trench 43 are formed in the layer insulating film 41, and the barrier metal layer 40 for improving the adhesiveness with the lower wiring layer and avoiding punchthrough is formed (FIG. 11B, and steps S62 and S63 of FIG. 12). As the barrier metal layer 40, a compact metal layer consisting of a single or multi layer of a metal such as titanium nitride (TiN), titanium (Ti), or tungsten nitride (WN) is formed at a thickness of about 100 nm.

Next, a photoresist 30 is applied to the whole face, and the opening C is formed in the resist in the region corresponding to the fuse portion by usual mask exposure and development processes. In the opening C of the photoresist 30, the metal layer 40 is removed away by selective etching (FIG. 11C and steps S64 to S66 of FIG. 12).

Thereafter, the photoresist 30 is removed away, the main conducting metal layer 13A of copper or the like is then formed in the via holes 42 and the trench 43 by a technique such as planning which is often employed in a usual process. At this time, after the main conducting metal layer 13A is embedded into the via holes 42 and the trench 43, a flattening process is performed by using at least one of a chemical mechanical polishing technique and an etchback technique. As a result, the fuse portion 13 and the pad electrode (not shown) are formed. The inorganic insulating protective film 14 such as a plasma silicon nitride film is formed thereon (FIG. 11D, and steps S67 to S69 of FIG. 12).

The subsequent steps are identical with those of the third embodiment. In the region of the opening A, the inorganic insulating protective film 20 above the fuse portion 13 is thinned to a thickness of about 0.1 to 0.8 $\mu$m by etching, the organic insulating protective film 15 such as polyimide is then formed, and the opening 16 of the organic insulating protective film 15 is formed above the fuse portion 13. Also the opening of the inorganic insulating protective film 20 and the organic insulating protective film 15 above the pad electrode (not shown) can be formed in the same manner as that of the third embodiment.

In the third embodiment, the plug electrode 29 of a metal such as tungsten is formed in the via holes 27 (step S44), and the main conducting metal layer 13A for the fuses is formed thereon (step S49). By contrast, in the fourth embodiment, the main conducting metal layer 13A for the fuses is formed in both the via holes 42 and the trench 43 (step S68).

[Fifth Embodiment]

Figure 13A:
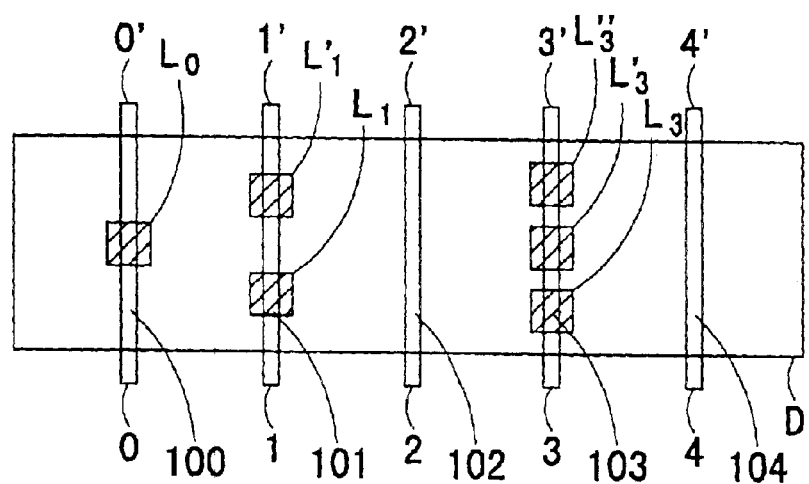
FIGS. 13A and 13B are plan views of a semiconductor integrated circuit device of a fifth embodiment of the invention.
Figure 13B:
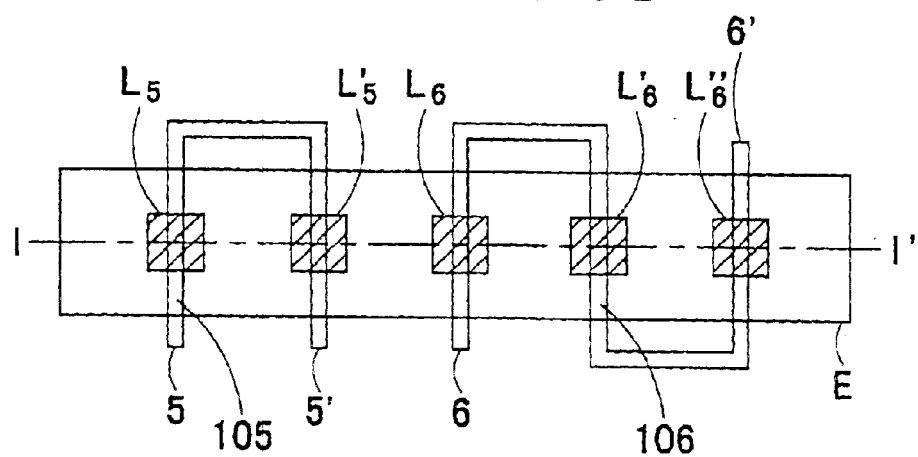

The fifth embodiment can be applied to the above-described first to fourth embodiments. Hereinafter, only main portions of the embodiment will be described. FIGS. 13A and 13B are plan views showing arrangements of main portions of a semiconductor integrated circuit device of the fifth embodiment of the invention. Referring to FIGS. 13A and 13B, 100 to 106 denote fuse wirings in each of which one fuse portion that is electrically continuous is formed, D and E denote a thinned region of an inorganic insulating protective film functioning also as an opening of an organic insulating protective film, and $L_0$, $L_1$, $L'_1$, $L_3$, $L'_3$, $L''_3$, $L_5$, $L'_5$, $L_6$, $L'_6$, and $L''_6$ denote laser beam irradiating areas.

Referring to FIG. 13A, conventionally, the fuse material of the fuse wiring 100 in the laser beam irradiating area $L_0$ only is fused off to electrically cut off ends 0 and 0' of the fuse wiring 100. By contrast, in the embodiment, with respect to the fuse wiring 101, ends 1 and 1' of the fuse wiring 101 are electrically cut off in the two laser beam irradiating areas $L_1$ and $L'_1$, and, with respect to the fuse wiring 103, ends 3 and 3' of the fuse wiring 103 are electrically cut off in the three laser beam irradiating areas $L_3$, $L'_3$, and $L''_3$. The fuse wirings 102 and 104 are not cut off.

When one fuse portion that is electrically continuous is cut off in plural positions as in the embodiment, the resistances due to the cutting off in the respective positions are connected in series. In the fuse, therefore, the total resistance due to the cutting off can be increased. Even if a cutting failure occurs in one of the fuse cutting positions, the cutting off is enabled in the other fuse cutting position, and hence the cutting off is performed more surely. In other words, the resistance due to the cutting off is multiplied by the number of the cutting positions, and the cutting certainty (probability) is a product of the cutting probabilities of the respective positions.

When the configuration shown in FIG. 13B is employed, the cutting off the fuse portions can be rapidly performed. In FIG. 13B, with respect to the two fuse wirings 105 and 106, ends 5 and 5' of the fuse wiring 105, and ends 6 and 6' of the fuse wiring 106 are electrically cut off in the laser beam irradiating areas $L_5$ and $L'_5$, and $L_6$, $L'_6$, and $L''_6$.

Specifically, the two fuse wirings 105 and 106 each having a plurality of fuse portions which can be cut off are disposed in the one opening E, and all the laser beam irradiating areas $L_5$, $L'_5$, $L_6$, $L'_6$, and $L''_6$ of the wirings are arranged on a straight line I—I'. In a laser processing apparatus, a laser feeding operation is usually realized by moving a wafer. According to the arrangement, laser beam irradiation can be performed along the straight line, and hence the fuse portions can be rapidly cut off while moving the semiconductor substrate without being stopped. As a result, the throughput can be improved, the productivity is enhanced, and the TAT can be shortened.

In the embodiment, each of the fuse wirings 102 to 106 has two or three cutting positions. The number of the areas is not restricted to them, and may have any value as far as it is a plural number. FIG. 13B shows the case where the two fuse wirings 105 and 106 are disposed in the single opening E. It is a matter of course that three or more fuse wirings may be disposed. As the number of the cutting positions is larger, the cutting certainty is higher. When the number of the cutting positions is large, however, the area occupied by the positions is increased. The increased area reduces the number of chips which are available from a wafer. In other words, the cutting certainty is a tradeoff with respect to the number of available chips, and the cutting positions are determined in accordance with the relationships between them.

When the configuration described above is to be applied to the third and fourth embodiments, the barrier metal layer is previously removed away so as not to exist below at least positions where the cutting off is to be performed (laser beam irradiating areas).

It is a matter of course that, even when the configuration of the embodiment is applied to the conventional one shown in FIG. 17, the peculiar effects described in the embodiment can be attained.

[Sixth Embodiment]

Figure 14:
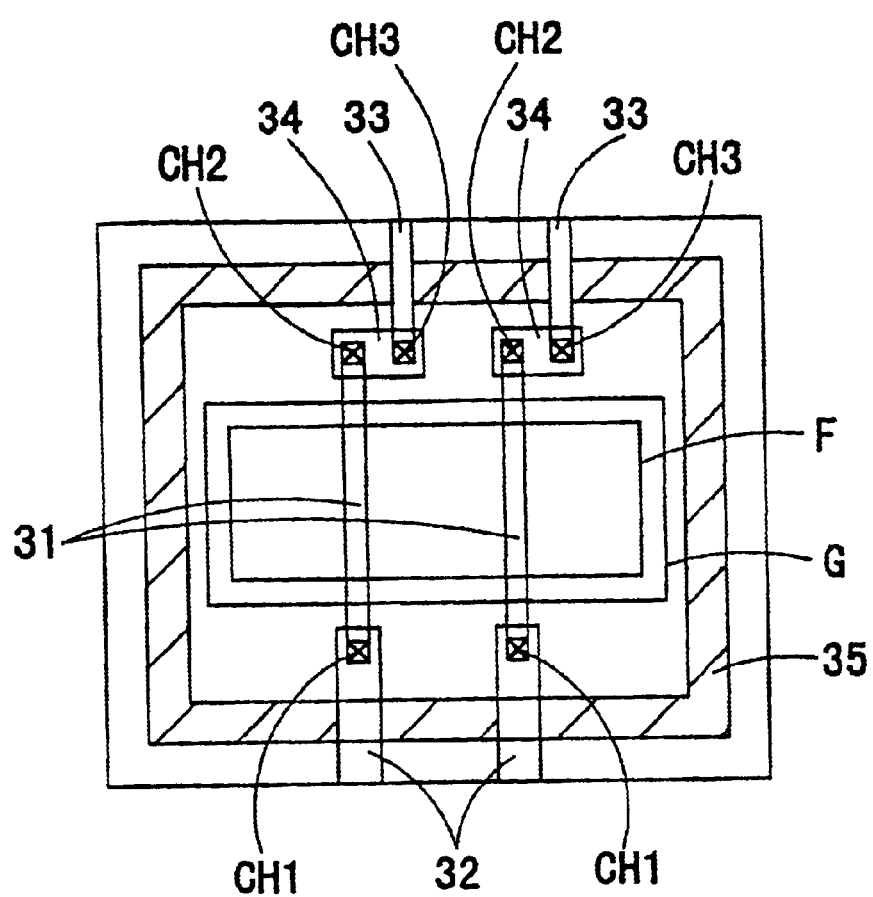
FIG. 14 is a plan view of a semiconductor integrated circuit device of a sixth embodiment of the invention.

The sixth embodiment can be applied to the above-described first to fifth embodiments (restricted to those in which the fuse portion is formed by the uppermost metal wiring layer). Hereinafter, only main portions of the embodiment will be described. FIG. 14 is a plan view showing main portions of a semiconductor integrated circuit device of the sixth embodiment of the invention. Referring to FIG. 14, 31 denotes fuse portions, 32, 33, and 34 denote metal wiring layers, 35 denotes a guard band, F denotes a thinned region of an inorganic insulating protective film, G denotes an opening of an organic insulating protective film, and CH1 to CH3 denote contact hole portions between wiring layers.

Referring to FIG. 14, the fuse portions 31 are formed by the uppermost metal wiring layer. One end of each of the fuse portions 31 is electrically connected in the corresponding contact hole portion CH1 to the wiring layer 32 which is lower than the uppermost layer by one level, through a plug metal. The other ends of the fuse portions 31 are electrically connected in the contact hole portions CH2 to the wiring layer 34 which is lower than the uppermost layer by one level, through a plug metal, and then in the contact hole portions CH3 to the wiring layer 33 through a plug metal. The wiring layer 33 may be the uppermost layer or the wiring layer which is lower than the uppermost layer by two levels.

It is a matter of course that a configuration other than that of FIG. 14 may be employed, or the change of the wiring layers at the ends of the fuse portions 31 may be an electrical wiring layer change in which contact hole portions are used once as in the case of the wiring layer 32, or that in which contact hole portions are used two or more times as in the case of the wiring layer 33. The size relationships between the thinned region F of the inorganic insulating protective film and the opening G of the organic insulating protective film are not particularly restricted.

The guard band 35 is formed by a conductive layer. As the conductive layer, the wiring layers ranging from the uppermost layer to the lowermost layer, the contact plug metal layer between wirings, the substrate, and the like may be used. The wiring layers and the like constituting the guard band 35 are electrically connected to one another. As shown in FIG. 14, the guard band 35 surrounds the peripheries of the contact hole portions CH1 to CH3. However, the wiring layers 32 and 33 serving as electrical leads for the fuse portions 31 are separated from the guard band by a predetermined distance. When the portions of the guard band 35 which cross the lead wiring layers 32 and 33 are configured by the wiring layers, therefore, a portion where the connection is partially failed is formed although the p is very small in area.

According to the embodiment, the fuse wiring can be reconnected in the contact holes CH1 to CH3 inside the guard bands 35, whereby the route along which water and ions permeate from the cut away part (not shown) of the fuse portion 31 via the fuse wiring that remains after the cutting off is prolonged. Since all the peripheries of the contact holes CH1 to CH3 are surrounded by the guard band 35, the inner side of the guard band can block penetration of water and ions, and hence water and ions are prevented from advancing to the outside of the guard band 35 (the semiconductor element portion), whereby the reliability can be improved. The plug metal which is to be embedded into the contact holes CH1 to CH3 is a metal such as tungsten which is hardly corroded. Therefore, also the corrosion reaction can be blocked by the plug metal portions in the contact holes CH1 to CH3.

The guard band 35 is connected to the semiconductor substrate, and the potential of the guard band 35 can be freely determined as far as it is within a well. In other words, the potential setting of positive, negative, or zero can be freely set. In the above, the example in which the single guard band 35 is used has been described. Although the area is increased, double guard bands may be used and the guard bands may be independently set to either of the positive and negative voltage application and the zero potential, so as to function as traps for negative and positive ions and water.

In the embodiment, the ends of the fuse portions 31 are connected to the lower wiring layer by means of the contact holes CH1 to CH3 having the plug metal portion. Alternatively, only one end of each of the fuse portions 31 may be connected to the lower wiring layer by means of the corresponding contact hole. In the alternative, the corrosion reaction and penetration of water and ions can be blocked by the one end.

Next, preferable dimensions of various portions in the case where, in the configurations of the first and second embodiments (see FIGS. 1 and 4), the fuse portions 13 are formed by at least the main conducting metal layer and the barrier metal layer which is formed below the main conducting metal layer will be described with reference to FIGS. 15 and 16A to 16C.

Figure 15:
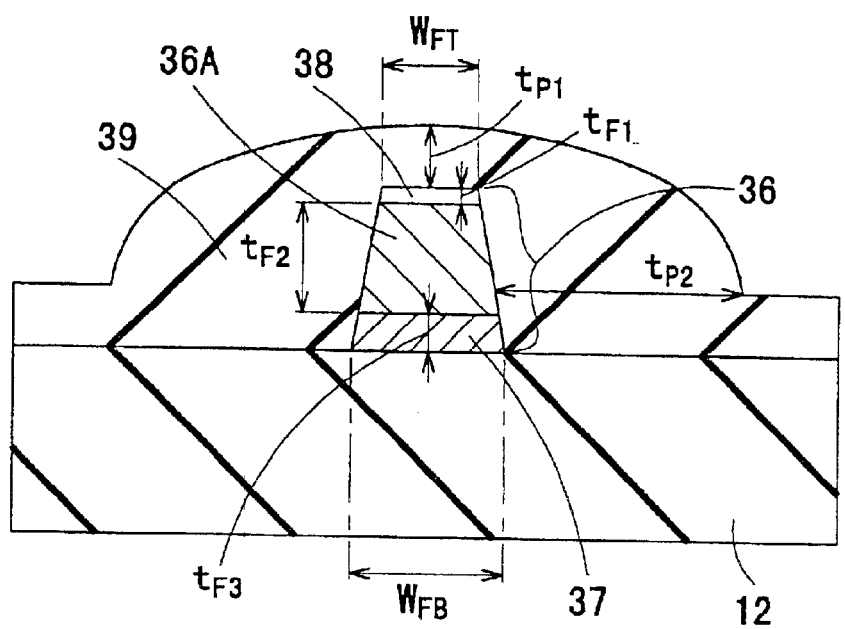
FIG. 15 is a section view illustrating preferable dimensions of various portions of a semiconductor integrated circuit device of an embodiment of the invention.
Figure 16A:
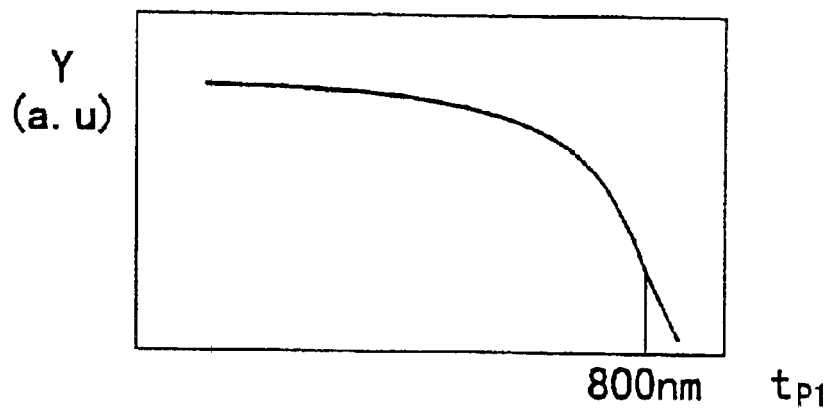
FIGS. 16A to 16C are views showing relationships between dimensions of various portions of a semiconductor integrated circuit device of an embodiment of the invention, and the cuttability of a fuse portion.
Figure 16B:
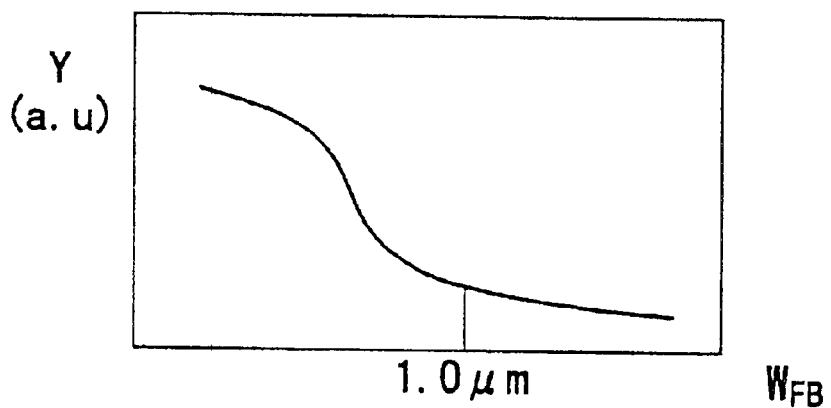
Figure 16C:
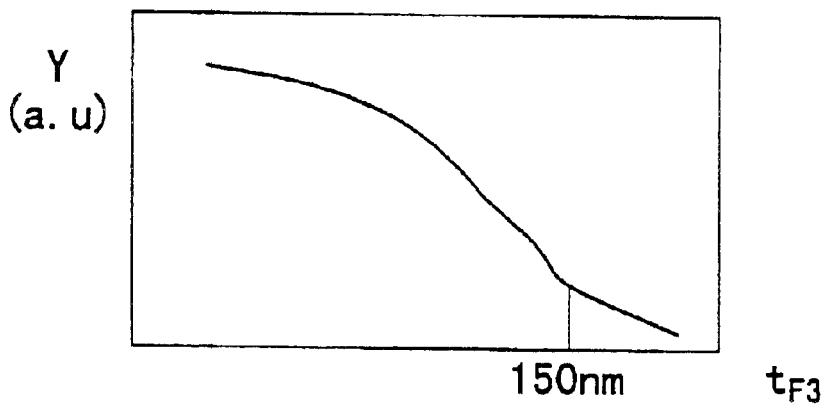

FIG. 15 is a section view illustrating dimensions of various portions of a semiconductor integrated circuit device of an embodiment of the invention. Referring to FIG. 15, 12 denotes a layer insulating film, 36 denotes a fuse portion, 36A denotes a main conducting metal layer made of aluminum or the like, 37 denotes a barrier metal layer, 38 denotes an antireflection film, and 39 denotes an inorganic insulating protective film. FIGS. 16A to 16C are views showing relationships between dimensions of various portions and the cuttability of the fuse portion with respect to laser beam irradiation.

Referring to FIG. 15, the fuse portion 36 which is configured by the uppermost metal wiring layer is formed on the layer insulating film 12, the inorganic insulating protective film 39 such as a plasma silicon nitride film is then formed at a thickness of about 1 μm, and the inorganic insulating protective film 39 is thinned by a usual dry etching process with using as a mask a resist which is opened in the region including the fuse portion 36. When the thickness of the inorganic insulating protective film 39 above the fuse portion 36 is indicated by $t_{p1}$, and that of the inorganic insulating protective film 39 on the side wall of the fuse portion 36 is indicated by $t_{p2}$, the relationship between thicknesses is indicated by the following expression:

$$t_{p1} < t_{p2}$$

This relationship is produced by the fact that the dry etching for thinning the inorganic insulating protective film 39 is anisotropic etching and the etching rate in the horizontal direction is lower than that in the vertical direction. This is identical with the principle of the technique for forming a side wall spacer on the gate electrode of a transistor having the LDD (Lightly Doped Drain) structure.

The cuttability Y (a.u.) of the fuse portion 36 is more excellent as the thickness $t_{p1}$ of the inorganic insulating protective film 39 above the fuse portion 36 is smaller. When evaluation is made while setting other conditions constant, it is preferable to set the thickness to about 800 nm or smaller as shown in FIG. 16A. When the upper width $W_{FT}$ of the fuse portion 36 and the lower width $W_{FB}$ ($\geq W_{FT}$) are larger than about 1.0 μm, the fuse portion 36 cannot be easily cut off (see FIG. 16B). When the thickness $t_{F3}$ of the barrier metal layer 37 is larger than 150 nm, the barrier metal and the like remain and the fuse cuttability is impaired (see FIG. 16C). When the barrier metal layer 37 is to be formed, therefore, its thickness is preferably set to be 150 nm or less.

In other words, the cuttability Y of the fuse portion 36 depends on the phenomenon that the energy is confined by the inorganic insulating protective film 39 so that explosion does not proceed until the fuse portion is sufficiently heated to a high temperature by a laser beam, and on whether the barrier metal layer 37 can be scattered or not. In the case where the thickness $t_{p1}$ of the inorganic insulating protective film 39 is excessively large, the energy for exploding the fuse portion 36 is applied so as to cause a damage in also the direction toward the layer insulating film 12, thereby producing cracks. Therefore, the upper limit (about 800 nm) of the thickness $t_{p1}$ of the inorganic insulating protective film 39 is set so that such a damage is not caused (FIG. 16A). The lower limit is a value which is set in consideration of the etching unevenness so that the film thickness of the fuse portion 36 itself is not varied by overetching of the fuse portion 36. Therefore, it is preferable to set the thickness $t_{p1}$ of the inorganic insulating protective film 39 to be in the range from 0.1 to 0.8 µm.

As the width $W_{FB}$ of the fuse portion 36 is larger, the possibility that the barrier metal layer 37 remains in the fitting off of the fuse portions is larger. With respect to the width, therefore, the smaller, the better. When the thickness $t_{F2}$ of the main conducting metal layer 36A made of an aluminum layer is in the vicinity of 500 nm, for example, the upper limit of the width of the fuse portion 36 is about 1.0 µm and the lower limit is defined by the fine processing limit. Therefore, it is preferable to set the width of the cutting region of the fuse portion 36 to the range of 0.1 to 1.0 µm. This is similarly applicable also to the case where, in the third or fourth embodiment, the thinning is performed while the barrier metal layer 13b or 40 (see FIGS. 9G, 11E, etc.) below the fuse portion 13 is not completely removed away.

With respect to the thickness $t_{F3}$ of the barrier metal layer 37, the smaller, the better. The lower limit of the thickness depends on the barrier properties in the contact portion, and cannot be set to 0 nm in the contact portion. Therefore, it is preferable to set the thickness $t_{F3}$ of the barrier metal layer 37 to about 50 to 150 nm. Of course, the thickness is not restricted to the range as far as barrier properties are attained.

The thickness $t_{F1}$ of the antireflection film 38 is selected to a value at which the antireflection effect against light from the exposure light source is attained. At the thickness of about 10 to 50 nm of a titanium nitride (TiN) film which is usually used, there arises no substantial difference in cutting properties.

As a laser beam for cutting off the fuse portion of the semiconductor integrated circuit device of the embodiment, preferably used is a laser beam configured by short pulses of infrared rays of a wavelength of 1,047 to 1,053 nm, emitted from, for example, a YLF (Yttrium-Lithium-Fluoride) crystal, and having a pulse width of about 2 to 10 nsec. Alternatively, a laser beam configured by infrared rays of a wavelength of 1,064 nm, emitted from a YAG (Yttrium-Aluminum-Garnet) single crystal, and having a pulse width of about 40 nsec. may be used. A pulse width which is shorter than 10 nsec. tends to be more advantageous in cutting off of a fuse portion of a metal wiring. This is caused by the fact that, when the pulse width is excessively long, the ground of a fuse portion is easily damaged.

In the case where, as shown in FIG. 15, the fuse portion 36 is configured by, for example, the antireflection film 38, the main conducting metal layer 36A, and the barrier metal layer 37, the main conducting metal layer 36A is made of an aluminum metal, and the antireflection film 38 and the barrier metal layer 37 are configured by a titanium nitride film or a titanium film, the cutting off of the fuse portion 36 may be performed by using a laser source having two or more wavelength components, whereby the production yield can be enhanced. In this example, a laser processing apparatus using a so-called SDWL (Simultaneous Dual Wavelength Laser) having two kinds of laser oscillation wavelengths or 1,340 nm and 1,050 nm is used. When a laser beam of a wavelength of 1,340 nm is used for cutting off the main conducting metal layer 36A configured by a metal which mainly contains aluminum, the heat absorption is highly conducted, and a large energy margin with respect to silicon of the ground semiconductor substrate can be set. The antireflection film 38 and the barrier metal layer 37 which are configured by a titanium nitride film or a titanium film can be thermally cut off by infrared rays of 1,050 nm. In other words, multi layer films having different absorption properties can be laser-processed. Since the laser energy margin can be set to be large, the use of this apparatus in the cutting off of a fuse can enhance the process yield.

What is claimed is:

1. A semiconductor integrated circuit device having a fuse portion for cutting off electrically using laser beam irradiation, said device comprising:

an insulating film formed over a semiconductor substrate, a metal wiring layer formed over said insulating film to provide said fuse portion, wherein said metal wiring layer comprises at least a barrier metal layer formed over said insulating film and a main conducting metal layer formed over said barrier metal layer.

2. A semiconductor integrated circuit device according to claim 1, wherein said barrier metal layer comprises one of a single film such as a titanium nitride (TiN) film, a titanium (Ti) film and a tungsten nitride (WN) film.

3. A semiconductor integrated circuit device according to claim 1, wherein said barrier metal layer has a thickness of 150 nm or less.

4. A semiconductor integrated circuit device according to claim 2, wherein said barrier metal layer has a thickness of 150 nm or less.

5. A semiconductor integrated circuit device according to claim 1, wherein said main conducting metal layer is made primarily of aluminum.

6. A semiconductor integrated circuit device according to claim 2, wherein said main conducting metal layer is made primarily of aluminum.

7. A semiconductor integrated circuit device according to claim 3, wherein said main conducting metal layer is made primarily of aluminum.

8. A semiconductor integrated circuit device according to claim 4, wherein said main conducting metal layer is made primarily of aluminum.

9. A semiconductor integrated circuit device according to claim 1, wherein said metal wiring layer of said fuse portion is further provided with an antireflection film formed on said main conducting metal layer.

10. A semiconductor integrated circuit device according to claim 1, wherein said semiconductor integrated circuit device comprises a plurality of metal wiring layers; and said metal wiring layer of said fuse portion is an uppermost metal wiring layer among the plurality of metal wiring layers.

11. A semiconductor integrated circuit device according to any one of claims 1 to 10, wherein a wiring width of said fuse portion where cutting off is to be performed is not smaller than 0.1 μm and not larger than 1.0 μm.

12. A semiconductor integrated circuit device according to claim 1, wherein said barrier metal layer further comprises a multi-layered film including a combination of at least two of a titanium nitride (TiN) film, a titanium (Ti) film and a tungsten nitride (WN) film.

* * * * *